(12) United States Patent
Furukawa

(10) Patent No.: US 6,569,603 B2
(45) Date of Patent: May 27, 2003

(54) LIGHT-SENSITIVE COMPOSITION AND METHOD FOR FORMING RELIEF IMAGE USING SAID COMPOSITION

(75) Inventor: Akira Furukawa, Tokyo (JP)

(73) Assignee: Mitsubishi Paper Mills Limited, Tokyo (JP)

( * ) Notice: Subject to any disclaimer, the term of this patent is extended or adjusted under 35 U.S.C. 154(b) by 0 days.

(21) Appl. No.: 09/771,568

(22) Filed: Jan. 30, 2001

(65) Prior Publication Data

US 2001/0018164 A1 Aug. 30, 2001

(30) Foreign Application Priority Data

Jan. 31, 2000 (JP) ........................................ 2000-021475
Jul. 25, 2000 (JP) ........................................ 2000-223304

(51) Int. Cl.$^7$ ........................... G03C 1/73; G03F 7/038; G03F 7/028; G03F 7/033; G03F 7/30
(52) U.S. Cl. ................................ 430/287.1; 430/281.1; 430/288.1; 430/306; 430/325; 430/919; 430/920; 430/921; 430/925; 430/926; 430/944; 522/26; 522/27; 522/28; 522/30; 522/52; 522/57; 522/59; 522/60; 522/61; 522/63; 522/65; 522/67; 522/68; 522/151; 522/153; 522/154; 522/167; 522/168; 522/178; 522/180
(58) Field of Search .................. 430/287.1, 281.1, 430/288.1, 325, 944, 925, 926, 919, 920, 921, 306; 522/26–28, 30, 52, 57, 59–61, 63, 65, 67, 68, 151, 153, 154, 167, 168, 178, 180

(56) References Cited

U.S. PATENT DOCUMENTS

| | | | | |
|---|---|---|---|---|
| 4,528,332 A | * | 7/1985 | Ai et al. .................. | 430/287.1 |
| 4,603,103 A | * | 7/1986 | Hirai et al. ................. | 430/559 |
| 4,701,399 A | * | 10/1987 | Nagano et al. ........... | 430/287.1 |
| 5,153,095 A | | 10/1992 | Kawamura et al. ...... | 430/287.1 |
| 5,206,113 A | * | 4/1993 | Mueller-Hess et al. .. | 430/270.1 |
| 5,413,863 A | * | 5/1995 | Weber et al. ............... | 428/428 |
| 5,496,685 A | * | 3/1996 | Farber et al. ............... | 430/306 |
| 6,114,092 A | * | 9/2000 | Miyagawa et al. ...... | 430/285.1 |

* cited by examiner

Primary Examiner—Janet Baxter
Assistant Examiner—Sin J. Lee
(74) Attorney, Agent, or Firm—Paul E. White, Jr.; Manelli, Denison & Selter PLLC

(57) ABSTRACT

There are disclosed a light-sensitive composition which comprises (A) a polymer having a phenyl group substituted by a vinyl group at a side chain, (B) a photopolymerization initiator and (C) a sensitizer which sensitizes the photopolymerization initiator, or a light-sensitive composition which comprises (A') a polymer, the above-mentioned (B) and (C), and (D) a monomer having at least two phenyl groups each of which is substituted by a vinyl group in the molecule of the monomer; and a method of forming a relief image which comprises coating the light-sensitive composition as mentioned above on a support, exposing the composition by exposure or scanning exposure and developing the same to form a relief image on the support.

56 Claims, No Drawings

LIGHT-SENSITIVE COMPOSITION AND METHOD FOR FORMING RELIEF IMAGE USING SAID COMPOSITION

BACKGROUND OF THE INVENTION

1. Field of the Invention

This invention relates to a light-sensitive composition and a method for forming a relief image utilizing the light-sensitive composition. More specifically, it relates to a light-sensitive composition which is capable of forming an image by using a scanning exposure device such as laser, etc. Also, it relates to a light-sensitive composition suitable for forming a lithographic printing plate, a resist for forming a printed circuit, a color filter or a phosphor pattern.

2. Prior Art

In a light-sensitive composition, its molecular structure causes chemical changes by a photoreaction, and as a result, changes occur in physical properties. As the chemical changes due to light, there are cross-linking, polymerization, decomposition, depolymerization, exchange in functional groups, etc., whereby various changes such as changes in solubility, adhesive property, refractive index, substance permeability, phase transfer, etc. occur. Such a light-sensitive composition has been practically used in various fields including a printing plate, resist, paint, coating agent, color filter, etc. Moreover, it has been used in the field of a photoresist using a photomechanical process (photolithography), and developed. The photoresist is a technique utilizing change in solubility by a photoreaction, and an accurate material design has been desired more and more due to the demand of high resolution.

A widely used type of lithographic printing plate has a light-sensitive coating film coated on an aluminum support. This coating film cures by exposure to light and the portion not exposed is dissolved by a developing treatment. This type of a plate is called to as a negative type printing plate. A lithographic printing plate utilizes surface properties of a pattern formed on the surface of the lithographic printing plate and a background portion having lipophilic property and hydrophilic property, respectively. When conducting lithographic printing, ink and damping water are simultaneously applied onto the printing surface of a printing press, and the ink is selectively transferred onto the pattern having lipophilic property. The ink transferred onto the pattern is then transferred to an intermediate material called to as a blanket and further transferred to a printing paper whereby printing is carried out.

Many researches have been conventionally done about light-sensitive composition for forming a relief image utilizing change in solubility by the photoreaction as mentioned above, and practically applicable materials have been provided. For example, in Japanese Patent Publications No. 34041/1974 and No. 105353/1994 and U.S. Pat. No. 5,153,095, etc., a light-sensitive composition mainly comprising a polymer having an ethylenically unsaturated bond at the side chain, a cross-linking agent and a photopolymerization initiator has been disclosed. Such a composition has a light-sensitive property to light having a short wavelength mainly at a ultraviolet rays region of 400 nm or shorter.

On the other hand, in recent years, it has been desired to develop a light-sensitive material having high sensitivity to visible rays accompanying with the progress of image forming techniques. For example, researches have been actively carried out on a light-sensitive material and a light-sensitive lithographic printing plate corresponding to an output machine using argon laser, helium-neon laser, red-color LED, etc.

Moreover, accompanying with the marked progress in semi-conductor laser, a near infrared laser light source having 700 nm to 1300 nm can be easily used whereby a light-sensitive material and a light-sensitive lithographic printing plate corresponding to said laser light has attracted attention.

As a photopolymerizable composition having a light-sensitive property at the above-mentioned visible rays to near infrared rays, there are disclosed a lithographic printing plate containing a radical polymerizable compound having an ethylenically unsaturated bond, a photosensitizing dye having an absorption peak at 400 to 500 nm and a polymerization initiator in Japanese Provisional Patent Publication No. 134007/1997; a combination of an organic boron anion and a dye in Japanese Provisional Patent Publications No. 143044/1987, No. 150242/1987, No. 5988/1993, No. 194619/1993, No. 197069/1997 and No. 2000-98603; a combination of a dye and an s-triazine compound in Japanese Provisional Patent Publications No. 31863/1992 and No. 43633/1994; a combination of a resol resin, a novolac resin, an infrared rays absorber and a photo-acid generator in Japanese Provisional Patent Publications No. 20629/1995 and No. 271029/1995; and a combination of a specific polymer, a photo-acid generator and a near infrared sensitizing dye in Japanese Provisional Patent Publications No. 212252/1999 and No. 231535/1999.

However, in the above-mentioned polymerizable compositions using the photopolymerization initiator or the photo-acid generator, it is difficult to provide sufficiently high light-sensitivity at the visible rays to near infrared region, and light-sensitivity was particularly insufficient for applying them to scanning exposure using various kinds of laser beams.

Also, in the above-mentioned polymerizable compositions, there is a problem that a latent image is regressed after exposure. That is, a portion exposed to light shall form an image after development. However, depending on a lapse of time from exposure to developing treatment, there is a problem that an image cannot sufficiently be formed, i.e., fading of a latent image. This phenomenon occurs between several ten minutes and several hours after exposure depending on the conditions of temperature and humidity as well as an exposed dose, etc.

Moreover, in the above-mentioned light-sensitive compositions, there is a problem that it is difficult to ensure stability and long-term preservability of sensitivity, etc. Thus, it has generally been carried out to provide an overcoating layer comprising polyvinyl alcohol, etc. on the light-sensitive layer for the purpose of heightening oxygen barrier property and preventing from causing flaws at the surface of the material. According to the presence of such an overcoating layer, there are problems of lowering image quality due to light scattering at the time of laser beam exposure, requiring to effect a pre-washing step for removing the overcoating layer prior to alkali development, and requiring to provide a step of further coating an overcoat layer after coating the light-sensitive layer for manufacture the material. Furthermore, in the polymerization using a photopolymerization initiator or a photo-acid generator, polymerization does not proceed sufficiently only by exposure to light in many cases so that it is necessary to effect a heat treatment after exposure or a developing treatment to progress and complete the polymerization. In particular, in the case of a light-sensitive lithographic printing plate material to which a light-sensitive property is provided at the wavelength region from visible rays to infrared rays, a heat treatment is an important preparation step. However, the heat treatment is not only lowering production efficiency but also contains a factor which makes product quality unstable. For example, it is difficult to maintain the difference in solubility between the exposed portion/unexposed portion constantly. Thus, when insufficient heating is carried out, there is a problem that the exposed portion is also dissolved by a developer, or else, when heating temperature is too high, there is a problem that the unexposed portion is partially insolubilized whereby development cannot sufficiently be carried out.

SUMMARY OF THE INVENTION

An object of the present invention is to provide a light-sensitive composition having high sensitivity, in particular, to provide a light-sensitive composition having sufficiently high sensitivity with a wide range from visible rays to infrared rays. Another object of the present invention is to provide a light-sensitive composition capable of subjecting to scanning exposure without heat treatment. A further object of the present invention is to provide a light-sensitive composition causing no fading of a latent image. A still further object of the present invention is to provide a method for forming a relief image utilizing the above-mentioned light-sensitive compositions.

The light-sensitive composition and the method for forming a relief image which are objects of the present invention are suitable for forming a lithographic printing plate, a resist for forming a printed circuit, a color filter or a phosphor pattern. In particular, the light-sensitive composition of the present invention can be preferably applied to a high-sensitivity lithographic printing plate suitable for subjecting to scanning exposure by using, for example, a near infrared laser, etc.

The above-mentioned objects of the present invention can be accomplished by using the following light-sensitive compositions.

(1) A light-sensitive composition comprises (A) a polymer having a phenyl group substituted by a vinyl group at a side chain of the polymer, (B) a photopolymerization initiator and (C) a sensitizer which sensitizes the photopolymerization initiator.

(2) A light-sensitive composition comprises (D) a monomer having at least two phenyl groups each of which is substituted by a vinyl group in the molecule of the monomer, (A') a polymer, (B) a photopolymerization initiator and (C) a sensitizer which sensitizes the photopolymerization initiator.

(3) A method of forming a relief image comprises coating the light-sensitive composition (1) or (2) as mentioned above on a support, exposing said composition by exposure and developing the same to form a relief image on the support.

DESCRIPTION OF THE PREFERRED EMBODIMENTS

In the following, the embodiments of the present invention are explained in detail. The polymer having a phenyl group substituted by a vinyl group at a side chain of the polymer to be used in the present invention is a polymer in which the phenyl group is bound to a main chain of the polymer directly or through a linking group. The linking group is not particularly limited and may include an optional group(s), atom(s) or a complex group of the group(s) and the atom(s). The phenyl group may be substituted by a substitutable group(s) or atom(s), and the vinyl group may be substituted by at least one selected from a halogen atom, a carboxy group, a sulfo group, a nitro group, a cyano group, an amide group, an amino group, an alkyl group, an aryl group, an alkoxy group and an aryloxy group. As the above-mentioned polymer having a phenyl group substituted by a vinyl group at a side chain of the polymer, it can be specifically mentioned those having a group represented by the following formula (I) at the side chain of the polymer.

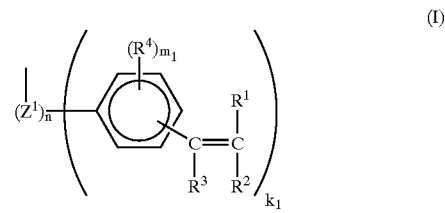

(I)

wherein $Z^1$ represents a linking group, $R^1$, $R^2$ and $R^3$ each represent a hydrogen atom, a halogen atom, a carboxy group, a sulfo group, a nitro group, a cyano group, an amide group, an amino group, an alkyl group, an aryl group, an alkoxy group or an aryloxy group, each of which may be substituted by at least one of an alkyl group, an amino group, an aryl group, an alkenyl group, a carboxy group, a sulfo group and a hydroxy group; $R^4$ represents a substitutable group or atom, n represents 0 or 1, $m_1$ represents an integer of 0 to 4, and $k_1$ represents an integer of 1 to 4.

The group represented by the formula (I) is explained in more detail. As the linking group $Z^1$, there may be mentioned an oxygen atom, a sulfur atom, an alkylene group, an alkenylene group, an arylene group, —N($R^5$)—, —C(O)—O—, —C($R^6$)=N—, —C(O)—, a sulfonyl group, a heterocyclic group and a group represented by the following formula (III), which may be alone or a complex group of two or more of the above. Here, $R^5$ and $R^6$ each represent a hydrogen atom, an alkyl group or an aryl group. Moreover, to the above-mentioned linking groups, at least one of an alkyl group, an aryl group and a halogen atom may be substituted.

(III)

As the above-mentioned heterocyclic group, there may be mentioned, for example, a nitrogen-containing heterocyclic ring such as a pyrrole ring, a pyrazole ring, an imidazole ring, a triazole ring, a tetrazole ring, an isoxazole ring, an oxazole ring, an oxadiazole ring, an isothiazole ring, a thiazole ring, a thiadiazole ring, a thiatriazole ring, an indole ring, an indazole ring, a benzimidazole ring, a benzotriazole ring, a benzoxazole ring, a benzothiazole ring, a benzoselenazole ring, a benzothiadiazole ring, a pyridine ring, a pyridazine ring, a pyrimidine ring, a pyrazine ring, a triazine ring, a quinoline ring and a quinoxaline ring; and a furan ring and a thiophene ring; each of which may be substituted by at least one substituent.

Examples of the group represented by the formula (I) are mentioned below but the present invention is not limited by these examples.
(K-1)
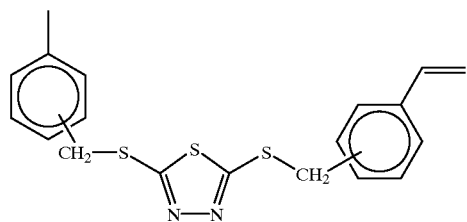
(K-2)
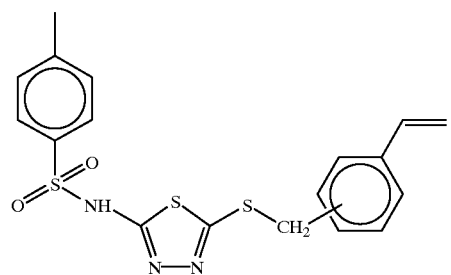
(K-3)
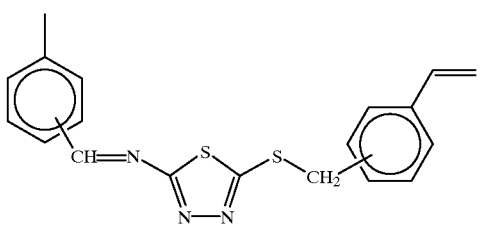
(K-4)
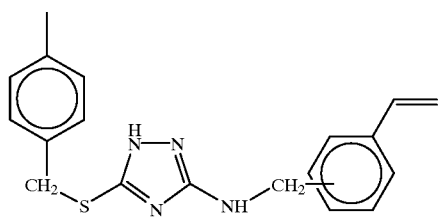
(K-5)
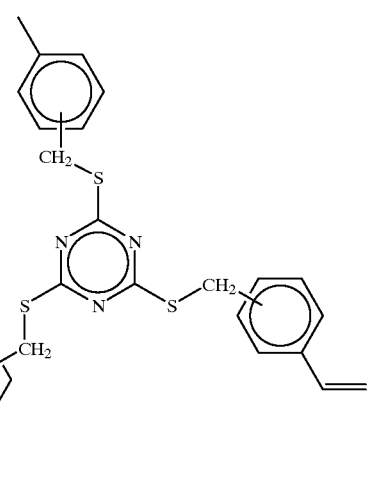
(K-6)
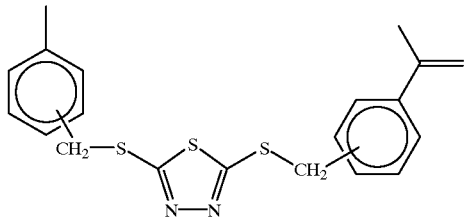
(K-7)
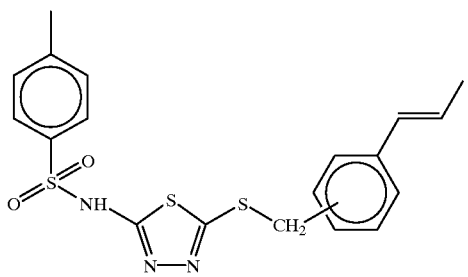
(K-8)
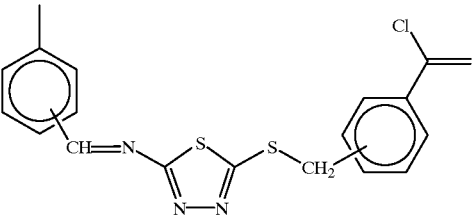
(K-9)
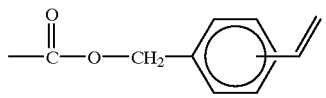
(K-10)
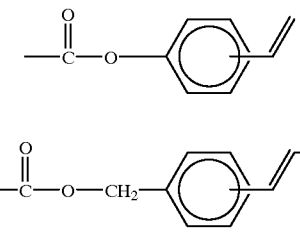
(K-11)
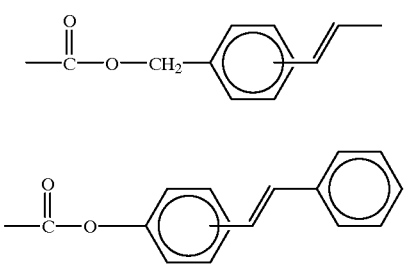
(K-12)
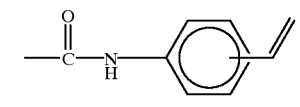
(K-13)
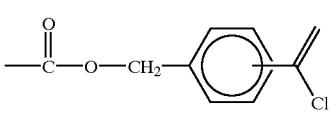
(K-14)

-continued

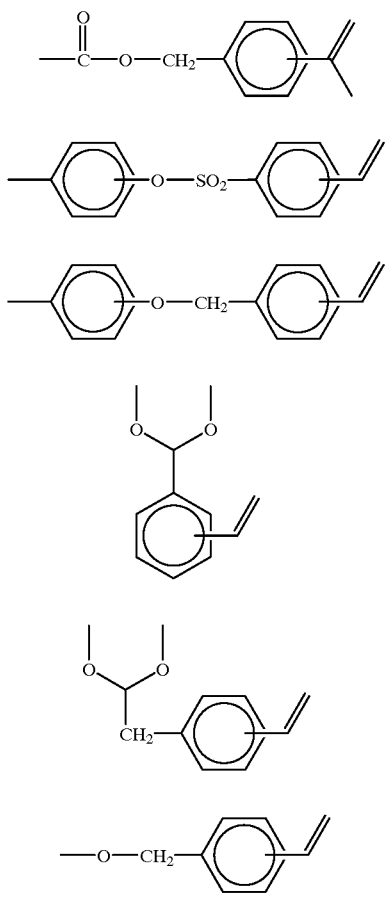

In the group represented by the formula (I), there are preferred groups. That is, the group wherein $R^1$ and $R^2$ are both hydrogen atoms, $R^3$ is a hydrogen atom or a lower alkyl group having 4 or less carbon atoms such as a methyl group, an ethyl group, etc. is preferred. Moreover, those having a heterocyclic group as the linking group $Z^1$ are preferred and $k_1$ is preferably 1 or 2.

As the polymer having the group shown by the above-mentioned example, it is preferred to have solubility in an aqueous alkaline solution, and particularly preferably a polymer containing a monomer having a carboxyl group as a copolymerizable component. In this case, as a ratio of the group represented by the formula (I) in the copolymer composition, it is preferred to be 1% by weight to 95% by weight, more preferably 5 to 80% by weight based on the total weight of the copolymer. If an amount of the group represented by the formula (I) is less than 1% by weight, the effect of incorporating the group cannot be admitted in some cases, while if it exceeds 95% by weight, the copolymer does not dissolve in an aqueous alkaline solution in some cases. Moreover, it is preferred to contain the monomer having a carboxyl group in the copolymer in an amount of 5% by weight to 99% by weight based on the total weight of the copolymer. If an amount of the monomer is less than 1% by weight, the copolymer does not dissolve in an aqueous alkaline solution in some cases.

As the monomer having a carboxyl group, there may be mentioned, for example, acrylic acid, methacrylic acid, 2-carboxyethyl acrylate, 2-carboxyethyl methacrylate, crotonic acid, maleic acid, fumaric acid, monoalkyl maleate, monoalkyl fumarate, 4-carboxystyrene, etc.

It is also possible to prepare a copolymer by incorporating a monomer other than the monomer having a carboxyl group in the copolymer to form a multi-component copolymer. As such a monomer to be incorporated into the copolymer, there may be mentioned, for example, a styrene derivative such as styrene, 4-methylstyrene, 4-hydroxystyrene, 4-acetoxystyrene, 4-carboxystyrene, 4-aminostyrene, chloromethylstyrene, 4-methoxystyrene, etc.; alkyl methacrylate such as methyl methacrylate, ethyl methacrylate, butyl methacrylate, hexyl methacrylate, 2-ethylhexyl methacrylate, cyclohexyl methacrylate, dodecyl methacrylate, etc.; aryl methacrylate or aralkyl methacrylate such as phenyl methacrylate, benzyl methacrylate, etc.; a methacrylic acid ester having a hydroxyalkyl group such as 2-hydroxyethyl methacrylate, 2-hydroxypropyl methacrylate, etc.; a methacrylic acid ester having an alkyleneoxy group such as methacrylic acid methoxydiethylene glycol monoester, methacrylic acid methoxypolyethylene glycol monoester, methacrylic acid polypropylene glycol monoester, etc.; methacrylate having an amino group such as 2-dimethylaminoethyl methacrylate, 2-diethylaminoethyl methacrylate, etc.; or acrylates corresponding to the above-mentioned methacrylates; a monomer having a phosphate group such as vinyl phosphonic acid, etc.; a monomer having an amino group such as allyl amine, diallyl amine, etc.; a monomer having a sulfonic acid group such as vinylsulfonic acid or a salt thereof, allylsulfonic acid or a salt thereof, methallylsulfonic acid or a salt thereof, styrenesulfonic acid or a salt thereof, 2-acrylamide-2-methylpropanesulfonic acid or a salt thereof, etc.; a monomer having a nitrogen-containing heterocyclic ring such as 4-vinylpyrrolidine, 2-vinyl-pyrrolidine, N-vinylimidazole, N-vinylcarbazole, etc.; a monomer having a quaternary ammonium salt group such as 4-vinyl benzyltrimethyl ammonium chloride, acryloyloxyethyltrimethyl ammonium chloride, methacryloyloxyethyltrimethyl ammonium chloride, a quaternized product of dimethylaminopropyl acrylamide by methyl chloride, a quaternized product of N-vinylimidazole by methyl chloride, 4-vinylbenzylpyridinium chloride, etc.; acrylonitrile, methacrylonitrile, etc.; an acrylamide or methacrylamide derivative such as acrylamide, methacrylamide, dimethylacrylamide, diethylacrylamide, N-isopropylacrylamide, diacetoneacrylamide, N-methylolacrylamide, N-methoxyethylacrylamide, 4-hydroxyphenylacrylamide, etc.; phenylmaleimide, hydroxyphenylmaleimide; a vinyl ester such as vinyl acetate, vinyl chloroacetate, vinyl propionate, vinyl butyrate, vinyl stearate, vinyl benzoate, etc.; a vinyl ether such as methyl vinyl ether, butyl vinyl ether, etc.; and other monomers such as N-vinylpyrrolidone, acryloylmorpholine, tetrahydrofurfuryl methacrylate, vinyl chloride, vinylidene chloride, allyl alcohol, vinyl trimethoxysilane, glycidyl methacrylate, and the like. As a ratio of these monomers having no carboxyl group in the copolymer composition, they can be optionally incorporated into the composition with any ratio so long as the ratios of the group represented by the formula (I) and the monomer having a carboxyl group are maintained in preferred ranges.

The molecular weight of the above-mentioned copolymer is preferably within the range of 1,000 to 1,000,000, more preferably 10,000 to 300,000 in terms of a weight average molecular weight (Mw).

Examples of the polymer having the group represented by the formula (I) according to the present invention are shown below. In the formulae, the numeral means % by weight of the respective recurring units in the copolymer based on the total weight as 100% by weight.

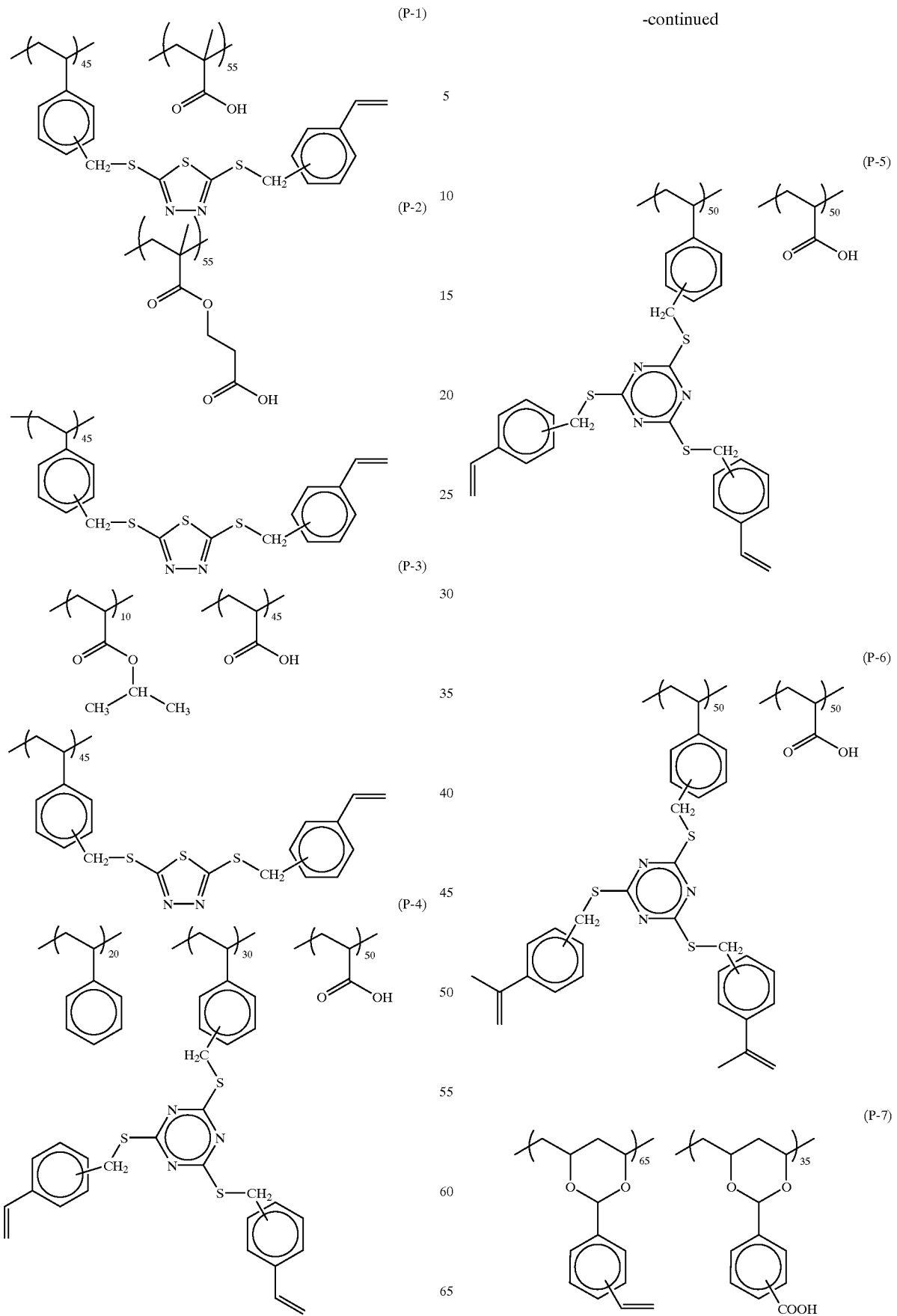

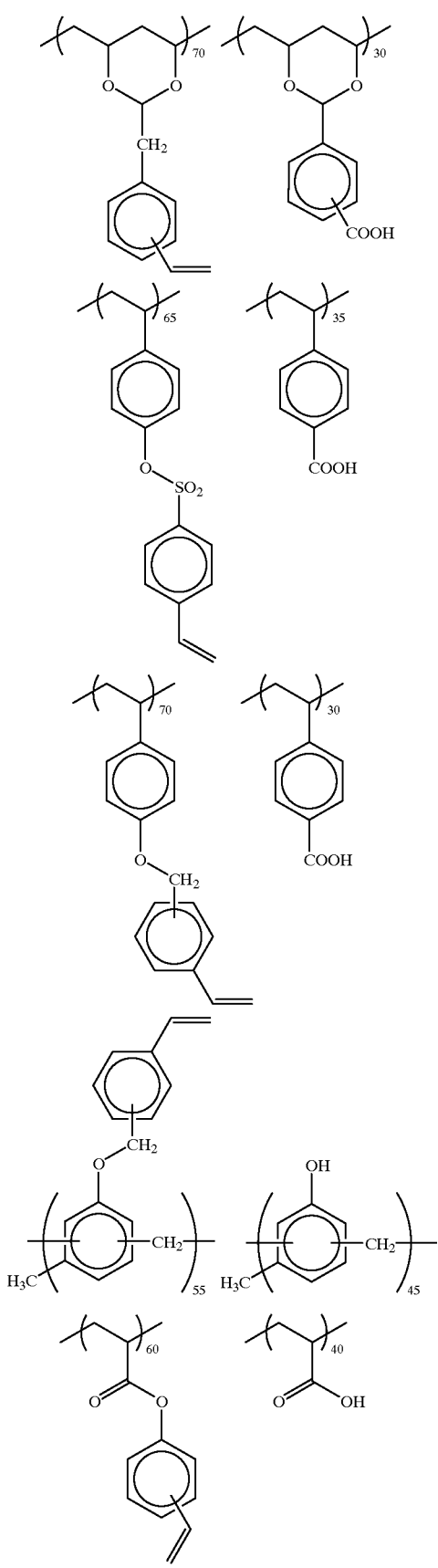
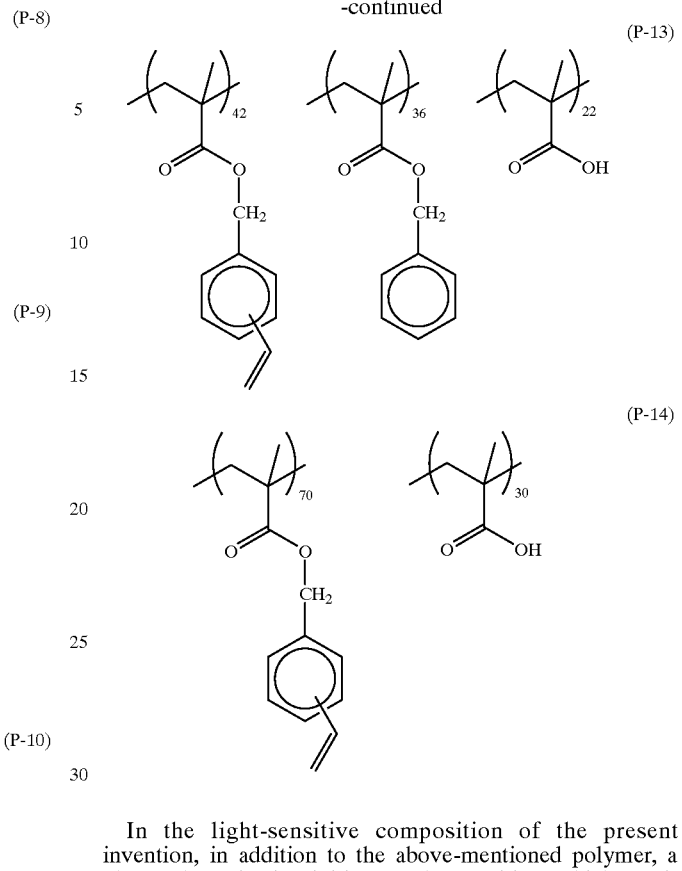

In the light-sensitive composition of the present invention, in addition to the above-mentioned polymer, a photopolymerization initiator and a sensitizer which sensitizes the photopolymerization initiator are contained. As the sensitizer, there may be preferably mentioned, for example, a sensitizing dye having absorption at the wavelength region of visible rays to infrared rays. Also, a sensitizing dye which sensitizes the photo-radical polymerization initiator with ultraviolet rays may be used. As the photopolymerization initiator to be used in the present invention, a photo-radical polymerization initiator which initiates polymerization by generating a radical by light is preferably used. The photo-radical polymerization initiator to be used in the present invention may be any compound so long as it can generate a radical by irradiation of light. As the compound, there may be mentioned, for example, an organic boron salt, a compound substituted by trihaloalkyl (e.g., as a nitrogen-containing heterocyclic compound substituted by trihaloalkyl, an s-triazine compound and an oxadiazole derivative, and a trihaloalkylsulfonyl compound may be mentioned), hexaarylbisimidazole, a titanocene compound, a ketoxime compound, a thio compound, an organic peroxide, etc. Among these photo-radical polymerization initiators, at least one of an organic boron salt and a trihaloalkyl-substituted compound is preferably used. More preferably, the organic boron salt and the trihaloalkyl-substituted compound are used in combination.

The organic boron anion constituting the organic boron salt is represented by the following formula (IV):

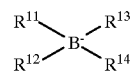

(IV)

wherein $R^{11}$, $R^{12}$, $R^{13}$ and $R^{14}$ may be the same or different from each other and each represent an alkyl group, an aryl group, an aralkyl group, an alkenyl group, an alkynyl group, a cycloalkyl group or a heterocyclic group.

In the compound of the above-mentioned formula (IV), a compound wherein one of the $R^{11}$, $R^{12}$, $R^{13}$ and $R^{14}$ is an alkyl group and the remaining other substituents are aryl groups is particularly preferred.

In the above-mentioned organic boron anion, a cation which forms a salt with the anion simultaneously exists. As the cation, there may be mentioned, for example, an alkali metal ion, an onium ion and a cationic sensitizing dye. As the onium salt, there may be mentioned, for example, an ammonium, sulfonium, iodonium and phosphonium compound may be mentioned. When a salt of the alkali metal ion or the onium compound with the organic boron anion is used, a sensitizing dye is separately added to provide a light-sensitivity at the wavelength region of light in which the dye is absorbed. Also, when an organic boron anion is contained as a pair ion of the cationic sensitizing dye, light-sensitivity is provided depending on the absorption wavelength of the sensitizing dye. However, in the latter case, it is preferred to use an organic boron anion further as a pair ion of the alkali metal or the onium salt.

One of the preferred embodiments of the present invention is a light-sensitive composition containing both of an organic boron salt and a sensitizing dye sensitizing the same. The organic boron salt at this time is a compound showing no light-sensitivity to light having an wavelength within the range of from visible rays to infrared rays, and firstly showing light-sensitivity to light with such wavelengths by adding the sensitizing dye.

As the organic boron salt to be used in the present invention, there may be mentioned a salt containing an organic boron anion represented by the above-mentioned formula (IV). As the cation for forming the salt, an alkali metal ion and an onium compound are preferably used. Particularly preferred example may include, as an onium salt with the organic boron anion, an ammonium salt such as a tetraalkyl ammonium salt, etc., a sulfonium salt such as a triaryl sulfonium salt, etc., and a phosphonium salt such as a triarylalkyl phosphonium salt, etc. Particularly preferred examples of the organic boron salts are mentioned below.

(BC-1)

Me—N⁺(Me)(Me)—Me    n-Bu—B(Ph)₃⁻

(BC-2)

n-Bu—N⁺(n-Bu)(n-Bu)—n-Bu    n-Bu—B(Ph)₃⁻

(BC-3)

n-Bu—P(Ph)₃⁺    n-Bu—B(Ph)₃⁻

(BC-4)

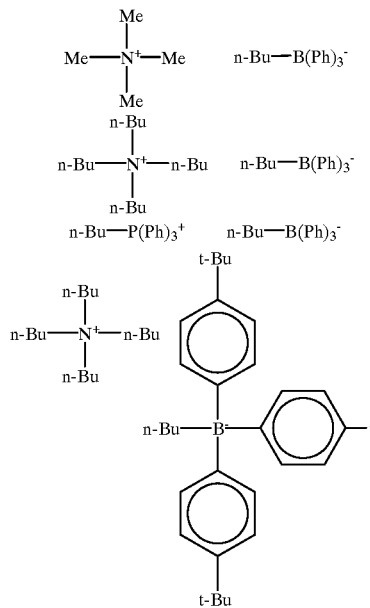

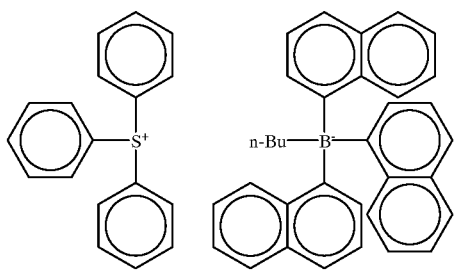

(BC-5)

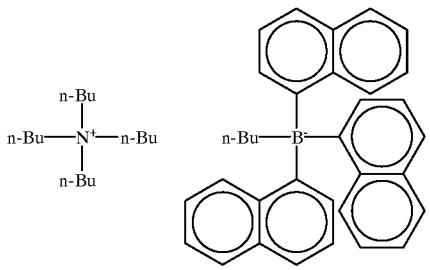

(BC-6)

In the present invention, as the other preferable photo-radical polymerization initiator, a trihaloalkyl-substituted compound may be mentioned. The trihaloalkyl-substituted compound means a compound having at least one of a trihaloalkyl group such as a trichloromethyl group, a tribromomethyl group, etc., in the molecule. Preferred examples thereof may include an s-triazine derivative as a compound in which said trihaloalkyl group is bound to a nitrogen-containing heterocyclic group, and an oxadiazole derivative. There may be also mentioned a trihaloalkyl sulfonyl compound in which said trihaloalkyl group is bound to an aromatic ring or a nitrogen-containing heterocyclic ring through a sulfonyl group.

Particularly preferred examples of the trihaloalkyl-substituted nitrogen-containing heterocyclic compound or trihaloalkyl sulfonyl compound are mentioned below.

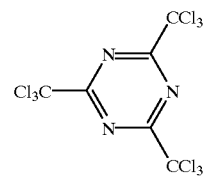

T-1

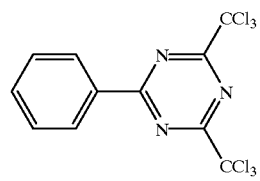

T-2

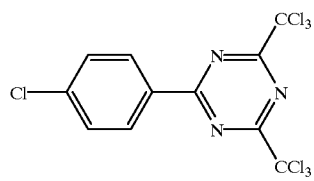

T-3

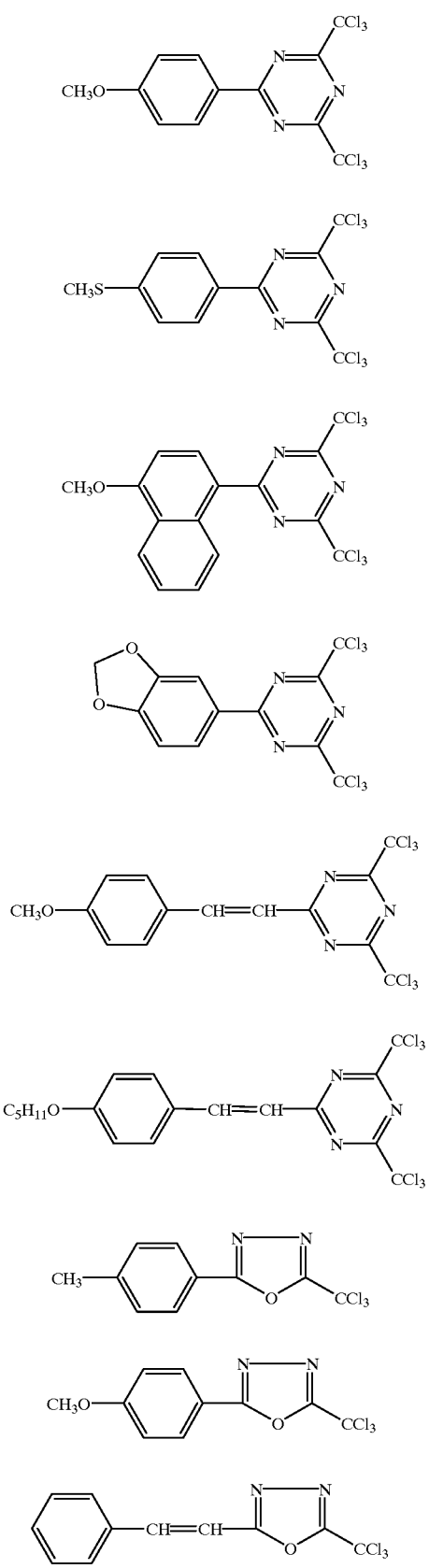
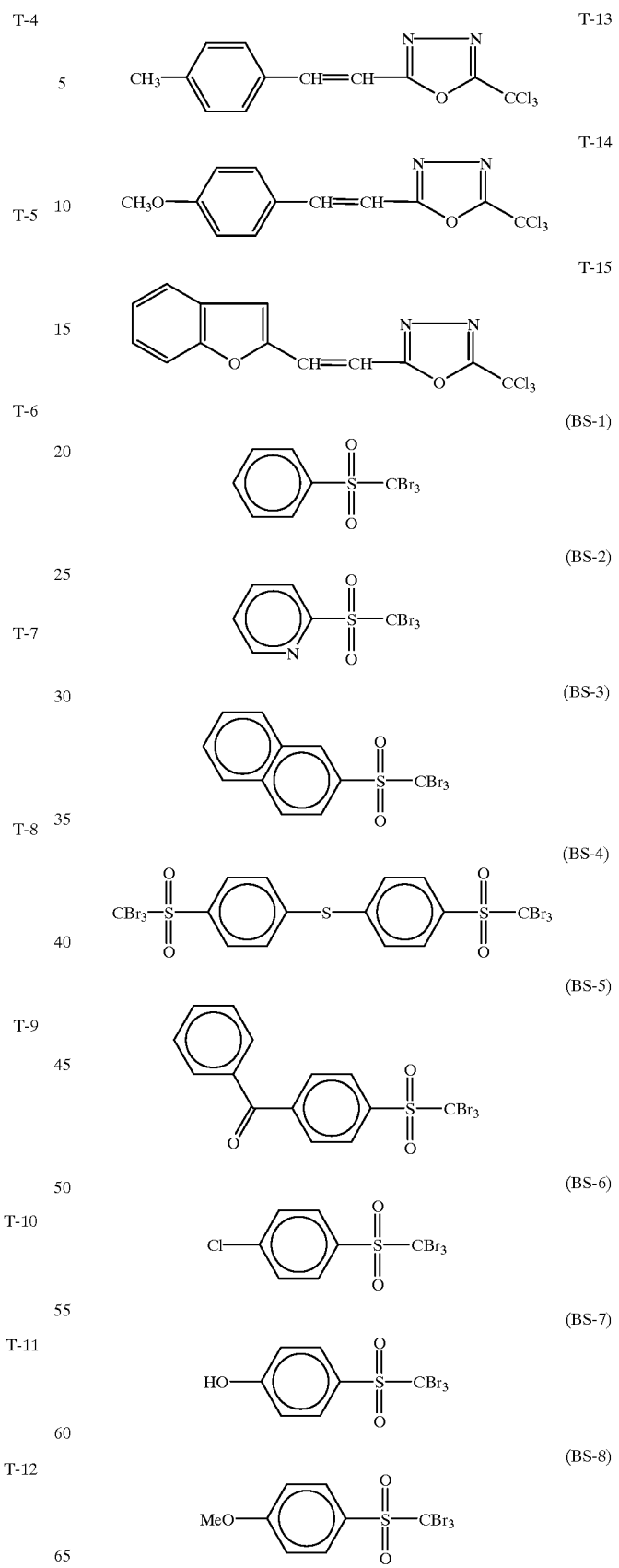

(BS-9)

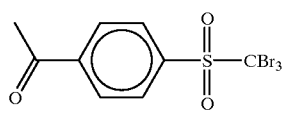

(BS-10)

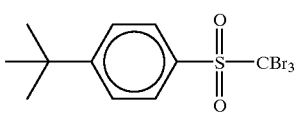

As the other photo-radical polymerization initiator to be used in the present invention, there is an organic peroxide. There may be mentioned, for example, cumen hydroperoxide, tert-butyl hydroperoxide, dichloroperoxide, di-tert-butyl peroxide, benzoyl peroxide, acetyl peroxide, lauroyl peroxide and the compound represented by the following formula:

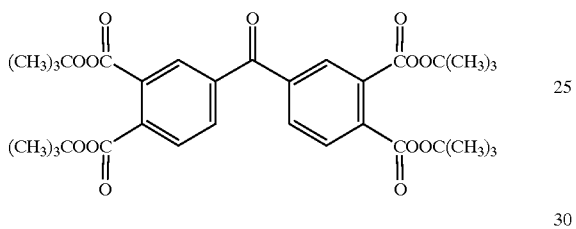

An amount of the above-mentioned photo-radical polymerization initiator is preferably in the range of 1 to 100% by weight, more preferably in the range of 1 to 40% by weight based on the amount of the polymer having a phenyl group substituted by a vinyl group at the side chain of the polymer.

The light-sensitive composition of the present invention contains a sensitizer which has absorption at wavelength region from visible rays to infrared rays and sensitizes the above-mentioned photo-radical polymerization initiator so as to correspond to various kinds of light sources from visible rays to infrared rays. As the sensitizer, various kinds of sensitizing dyes may be preferably used. Such sensitizing dyes may include, for example, cyanine, phthalocyanine, merocyanine, coumarin, porphyrin, a spiro compound, ferrocene, fluorene, fulgide, imidazole, perylene, phenazine, phenothiazine, polyene, an azo compound, diphenylmethane, triphenylmethane, polymethyne acridine, ketocoumarin, quinacridone, indigo, styryl, a squarylium compound, a pyrilium compound, a thiopyrilium compound, etc., and further, compounds disclosed in EP Patent No. 0 568 993, U.S Pat. Nos. 4,508,811 and 5,227,227 may be used.

Specific examples of sensitizing dyes having absorption to visible rays (400 to 700 nm) are shown below but the present invention is not limited by these.

S-1

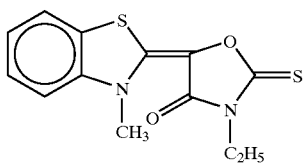

S-2

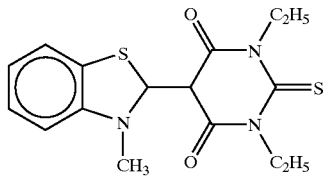

S-3

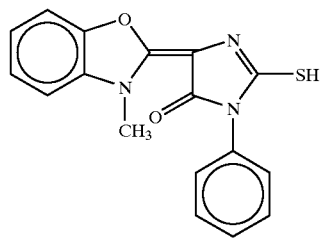

S-4

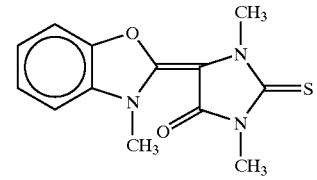

S-5

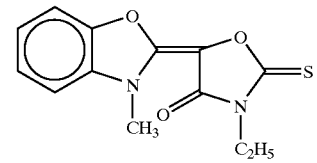

S-6

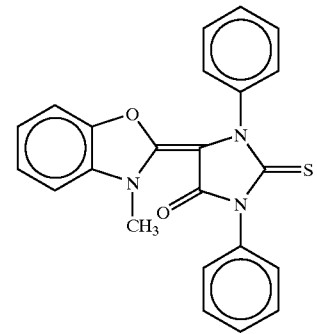

S-7

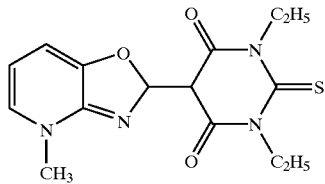

S-8

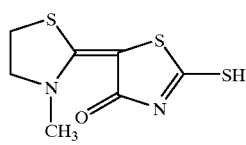

-continued
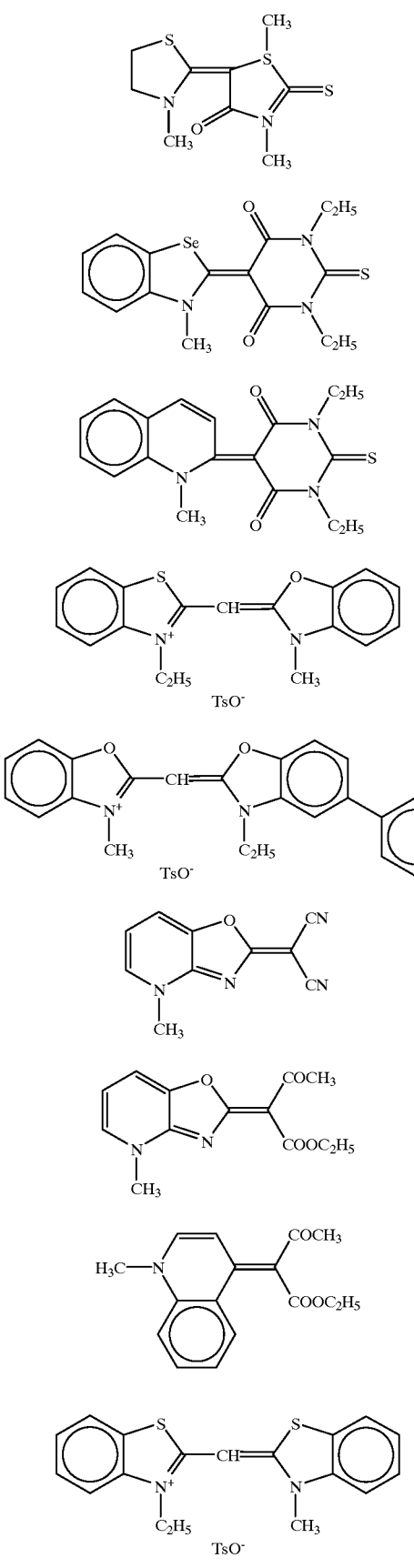
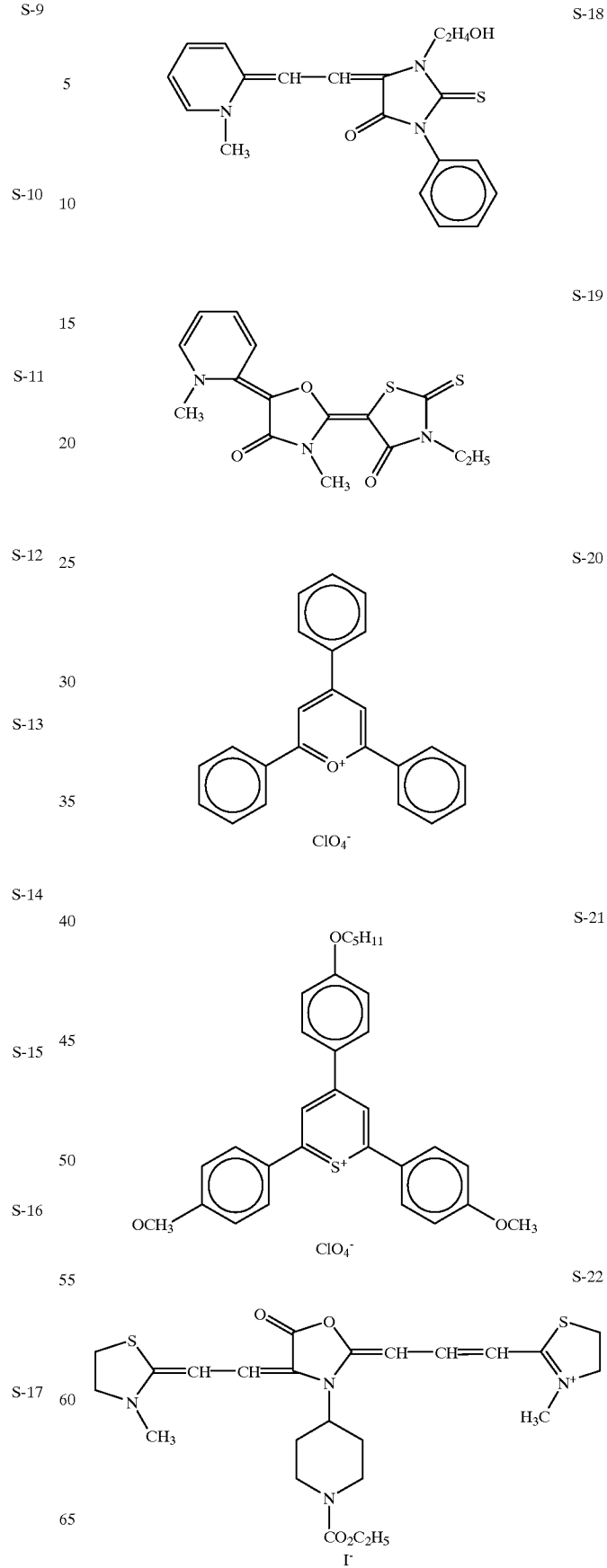

-continued

S-23
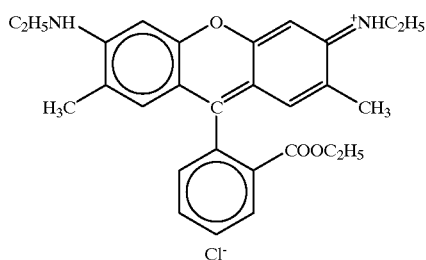

S-28
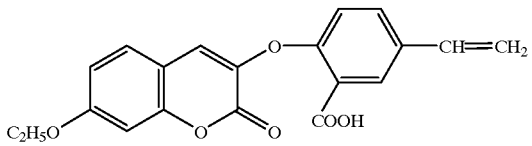

S-29

S-24
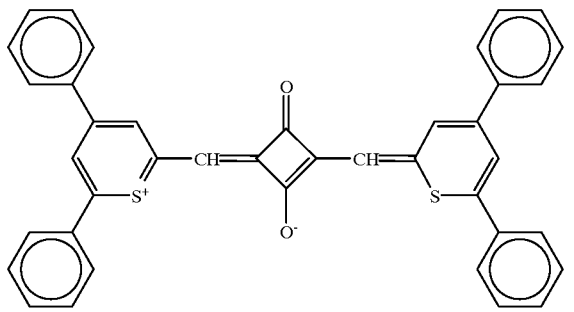

S-30

S-25
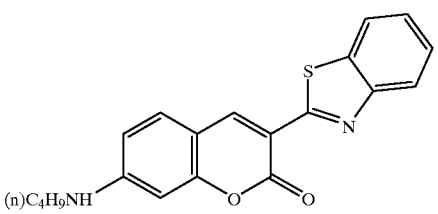

S-26
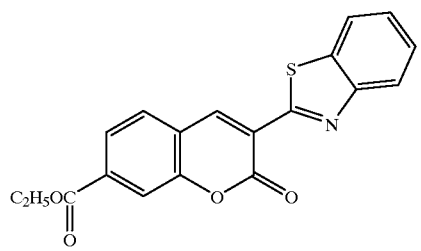

In recent years, an output machine mounted thereon a violet laser diode having an oscillation wavelength of 400 to 430 nm has been developed. This output machine has the maximum exposure energy dose of several tens $\mu J/cm^2$ or so and a light-sensitive material to be used is required to have high sensitivity. In the present invention, it can be realized to use the light-sensitive composition of the present invention in this output machine by using the above-mentioned sensitizing dye in combination. Among the above-mentioned sensitizing dyes, the pyrilium compound or the thiopyrilium compound is preferred for the violet laser diode. Also, the above-mentioned pyrilium compound and the thiopyrilium compound act as a sensitizing agent.

Also, the light-sensitive composition of the present invention can be extremely suitably used for light with near infrared rays to infrared rays, i.e., 700 nm or longer, further for scanning exposure using laser light with wavelength region of 750 to 1100 nm. Specific examples of sensitizing dyes to be used for sensitizing the composition to near infrared rays are shown below.

S-27
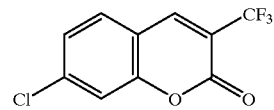

S-31
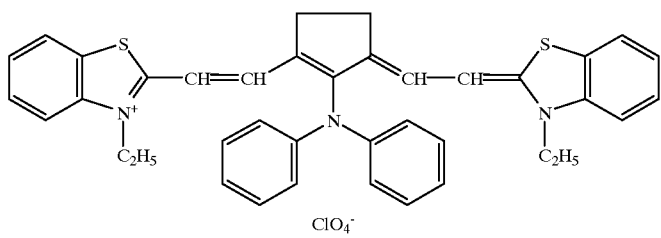

-continued
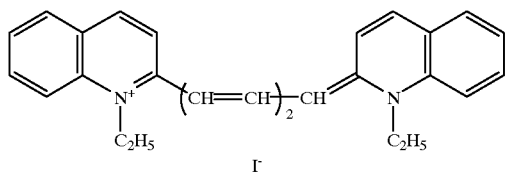
S-32
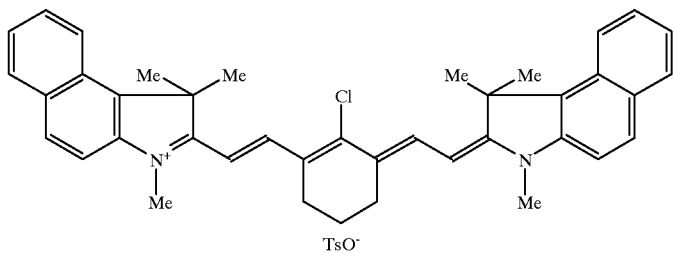
S-33
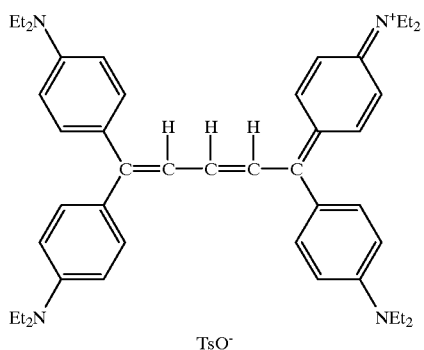
S-34
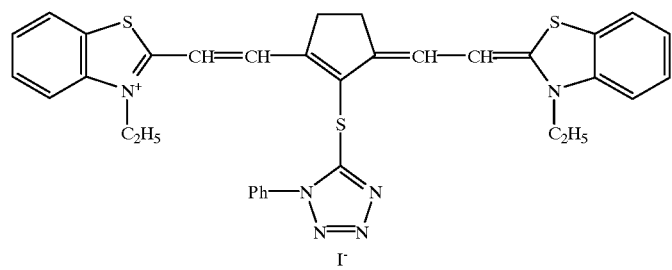
S-35
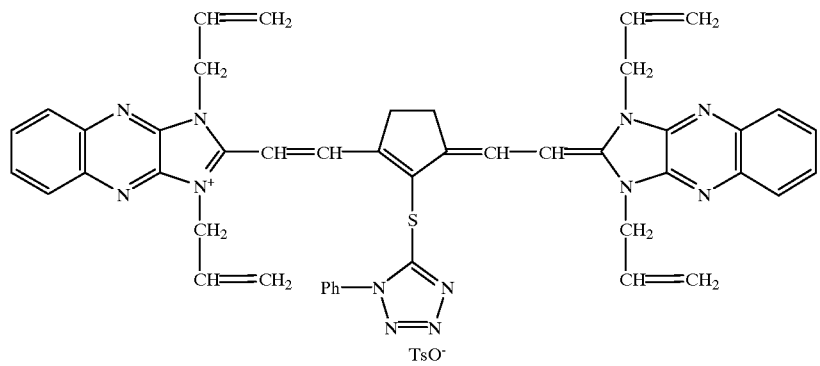
S-36

-continued
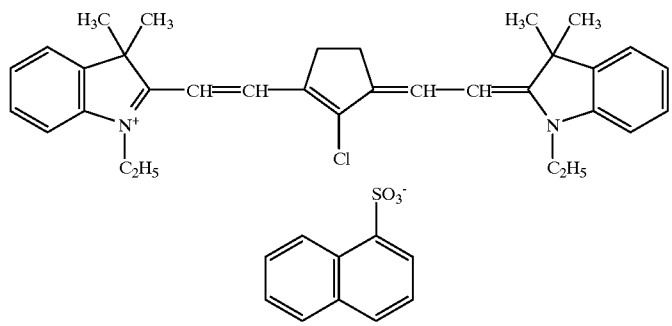
S-37
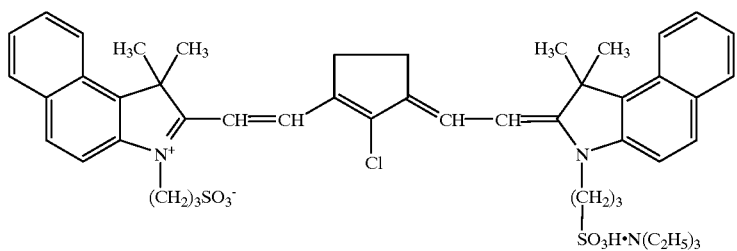
S-38
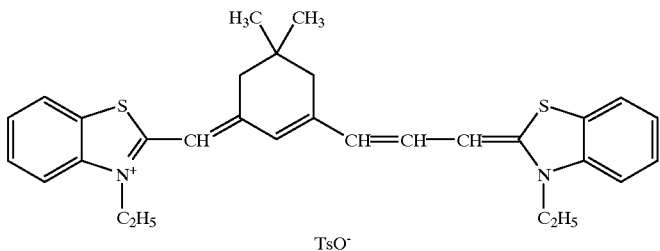
S-39
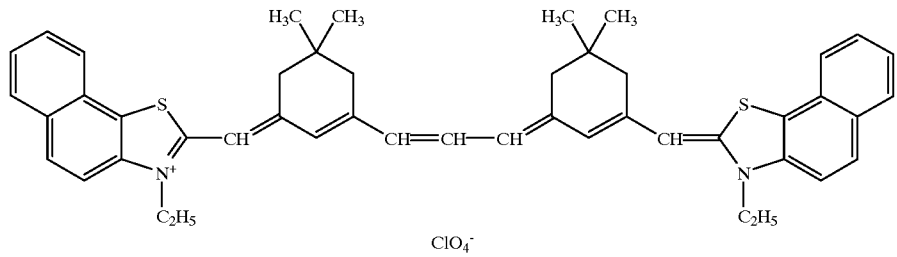
S-40
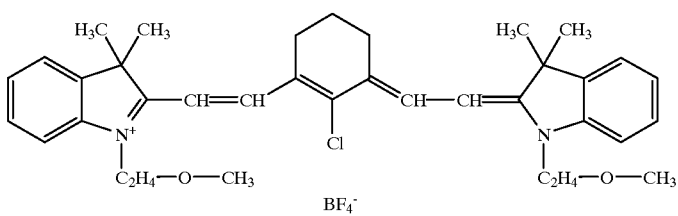
S-41

-continued

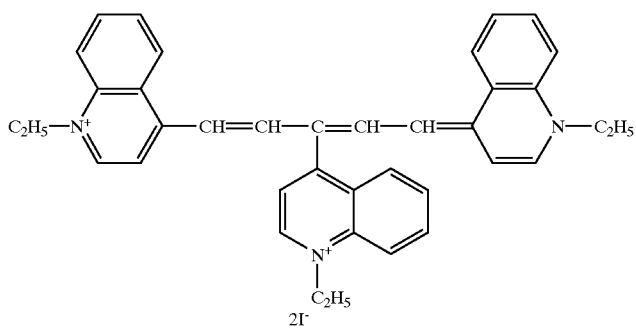
S-42

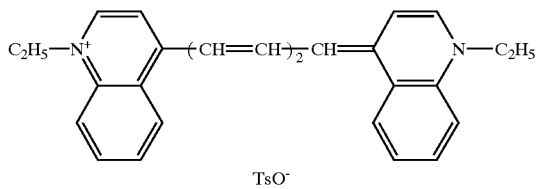
S-43

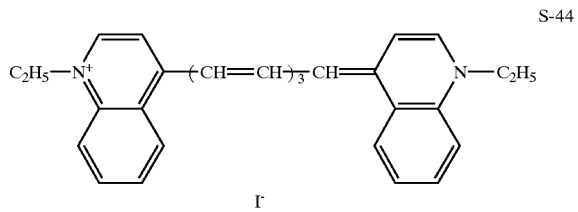
S-44

A pair anion of the exemplified sensitizing dyes as mentioned above is substituted for the above-mentioned organic boron anion can be used similarly in the present invention. An amount of the sensitizing dye is preferably 3 to 300 mg per 1 $m^2$ of the light-sensitive composition, more preferably 10 to 200 $mg/m^2$.

In the present invention, as the other preferred element constituting the light-sensitive composition, there may be mentioned a polymerizable compound having 2 or more polymerizable double bonds in the molecule which is a monomer or oligomer having a molecular weight (Mw: weight average molecular weight) of 10,000 or less, preferably 5,000 or less. Preferred examples of the polymerizable compound may include, for example, polyfunctional acrylic monomer such as 1,4-butandiol diacrylate, 1,6-hexanediol diacrylate, neopentylglycol diacrylate, tetraethyleneglycol diacrylate, trisacryloyloxyethyl isocyanurate, tripropyleneglycol diacrylate, ethyleneglycol glycerol triacrylate, glycerol epoxy triacrylate, trimethylolpropane triacrylate, pentaerythritol triacrylate, pentaerythritol tetraacrylate, andmethacrylates corresponding to the above-mentioned acrylates, etc.

Or else, in place of the above-mentioned polymeric compounds, an oligomer having radical polymerizability can be preferably used. Examples of such oligomers may include polyester acrylate, urethaneacrylate, epoxy acrylate, andmethacrylates corresponding to the above-mentioned acrylates, each of which maybe introduced an acryloyl group or methacryloyl group, etc., and they can be used similarly to the polymerizable compound.

With regard to the ratio of the above-mentioned polymerizable compound and the polymer having a phenyl group substituted by a vinyl group at the side chain of the polymer, there is a preferred range. The polymerizable compound is preferably contained in an amount in the range of 0.01 part by weight to 10 parts by weight, more preferably in the range of 0.05 part by weight to 1 part by weight based on 1 part by weight of the polymer.

When the conventional photo-radical polymerization is utilized for preparing a cured product, it is likely influenced by oxygen in air so that it is required to provide an overcoating layer on the surface of a light-sensitive layer such as polyvinyl alcohol, which has an oxygen barrier property. Also, it is required in the conventional technique to effect heat treatment at a temperature of around 100° C. for several minutes to proceed or complete the polymerization reaction after exposure.

To the contrary, when the polymer having a phenyl group substituted by a vinyl group at the side chain of the polymer is used, its characteristic features reside in that the composition provides a sufficiently photo-curable system without providing any overcoating layer, it is not necessary to carry out heat treatment after exposure and a light-sensitive composition having high sensitivity can be obtained by using a photo-radical polymerization initiator and a sensitizing dye in combination. Also, the light-sensitive composition of the present invention has a characteristic that fading of latent image is extremely small.

Next, another embodiment of the present invention, i.e., a light-sensitive composition comprising a polymer, a monomer having at least two phenyl groups each of which is substituted by a vinyl group in the molecule of the monomer, a photo-polymerization initiator and a sensitizer is explained below. As the above-mentioned photopolymerization initiator, a photo-radical polymerization initiator is preferably used.

When the monomer having at least two phenyl groups each of which is substituted by a vinyl group in the molecule of the monomer (hereinafter referred to as "the monomer of the present invention") is used, crosslinking is effectively carried out by recombination of styryl radicals formed by generated radicals so that a negative light-sensitive material which has high sensitivity and requires no heat treatment can be prepared.

The monomer of the present invention is representatively shown by the following formula (II):

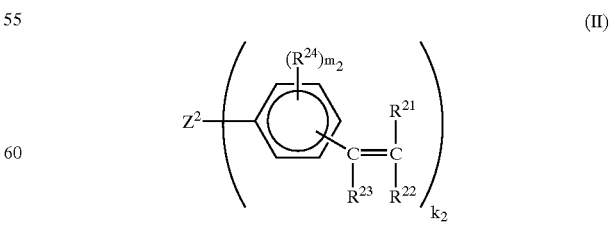
(II)

wherein $Z^2$ represents a linking group, $R^{21}$, $R^{22}$ and $R^{23}$ each represent a hydrogen atom, a halogen atom, a carboxy group, a sulfo group, a nitro group, a cyano group, an amide group, an amino group, an alkyl group, an aryl group, an alkoxy group or an aryloxy group, each of which may be substituted by at least one of an alkyl group, an amino group, an aryl group, an alkenyl group, a carboxy group, a sulfo group and a hydroxy group; $R^{24}$ represents a substitutable group or atom, $m_2$ represents an integer of 0 to 4, and $k_2$ represents an integer of 2 or more.

The compound of the formula (II) is explained in more detail below. As the linking group of $Z^2$, there may be mentioned, for example, an oxygen atom, a sulfur atom, an alkylene group, an alkenylene group, an arylene group, —N($R^5$)—, —C(O)—O—, —C($R^6$)=N—, —C(O)—, a sulfonyl group and a heterocyclic group, which may be alone or a complex group of two or more of the above. Here, $R^5$ and $R^6$ each represent a hydrogen atom, an alkyl group or an aryl group. Moreover, to the above-mentioned linking groups, at least one of an alkyl group, an aryl group and a halogen atom may be substituted.

As the above-mentioned heterocyclic group, there may be mentioned, for example, a nitrogen-containing heterocyclic ring such as a pyrrole ring, a pyrazole ring, an imidazole ring, a triazolering, a tetrazolering, anisoxazolering, anoxazole ring, an oxadiazole ring, an isothiazole ring, a thiazole ring, a thiadiazole ring, a thiatriazole ring, an indole ring, an indazole ring, a benzimidazole ring, a benzotriazole ring, a benzoxazole ring, a benzothiazole ring, a benzoselenazole ring, a benzothiadiazole ring, a pyridine ring, a pyridazine ring, a pyrimidine ring, a pyrazine ring, a triazine ring, a quinoline ring and a quinoxaline ring; and a furan ring and a thiophene ring; each of which may be substituted by at least one substituent.

In the compound represented by the formula (II), there are preferred compounds. That is, the compound wherein $R^{21}$ and $R^{22}$ are both hydrogen atoms, $R^{23}$ is a hydrogen atom or a lower alkyl group having 4 or less carbon atoms such as a methyl group, an ethyl group, etc., and $k_2$ is 2 to 10 is preferred. In the following, specific examples of the compounds represented by the formula (II) are shown but the present invention is not limited by these.

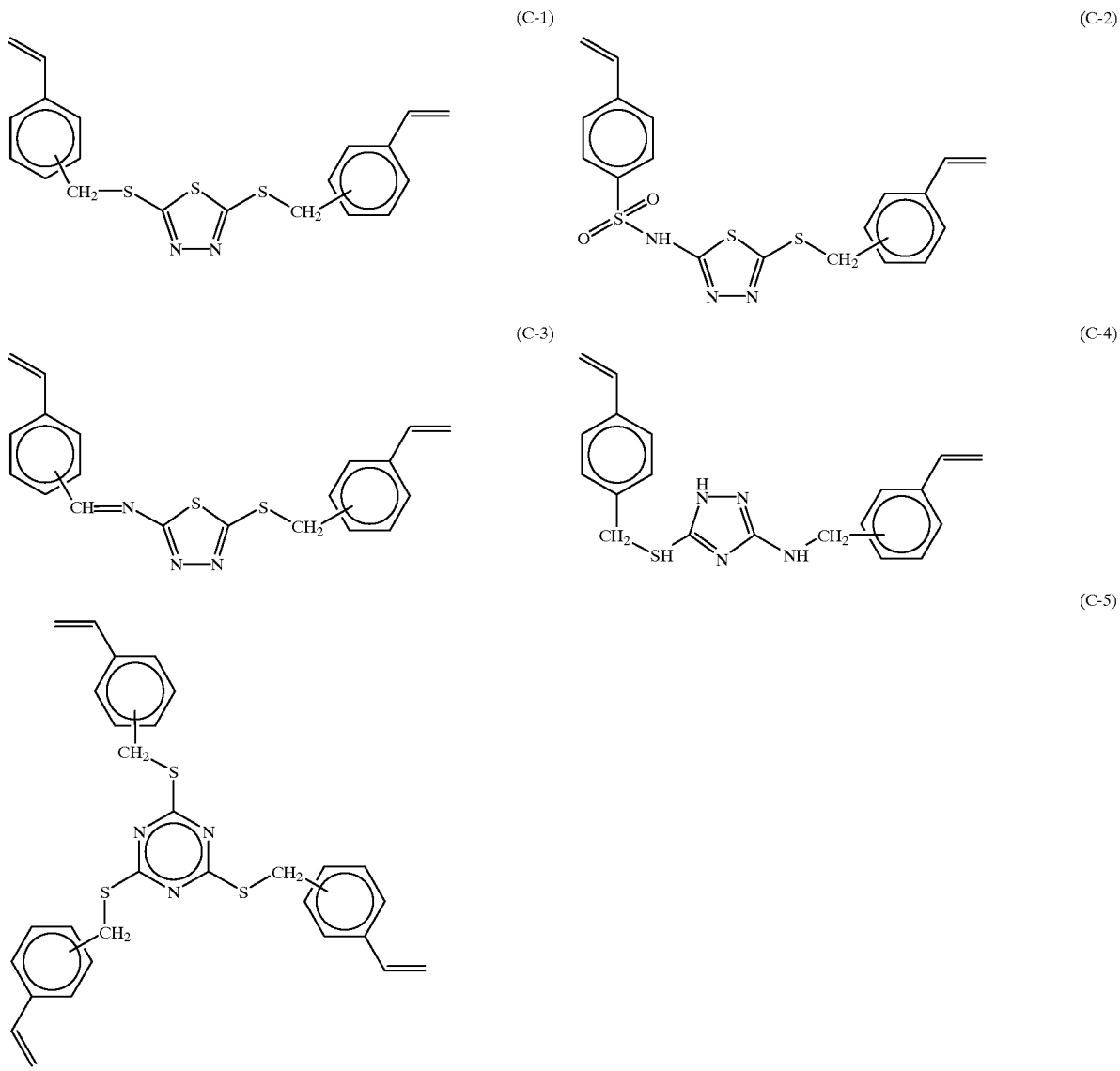

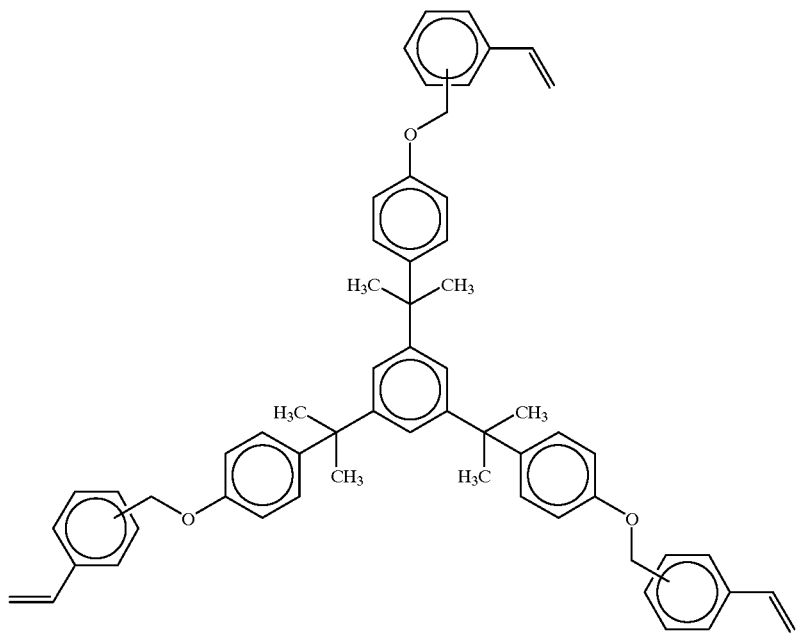
(C-6)
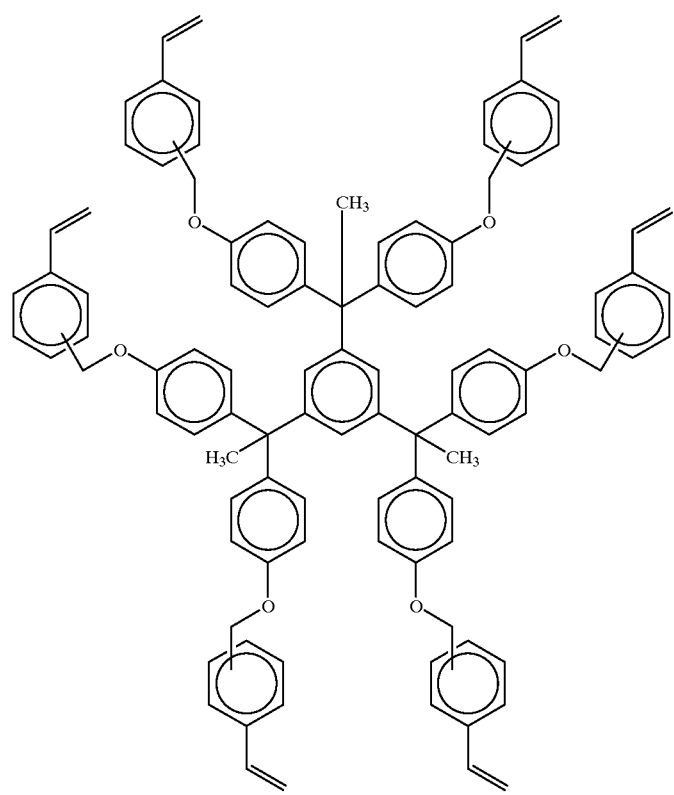
(C-7)
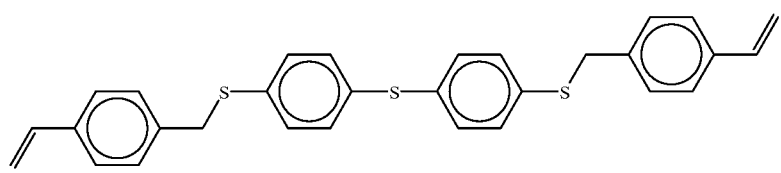
(C-8)

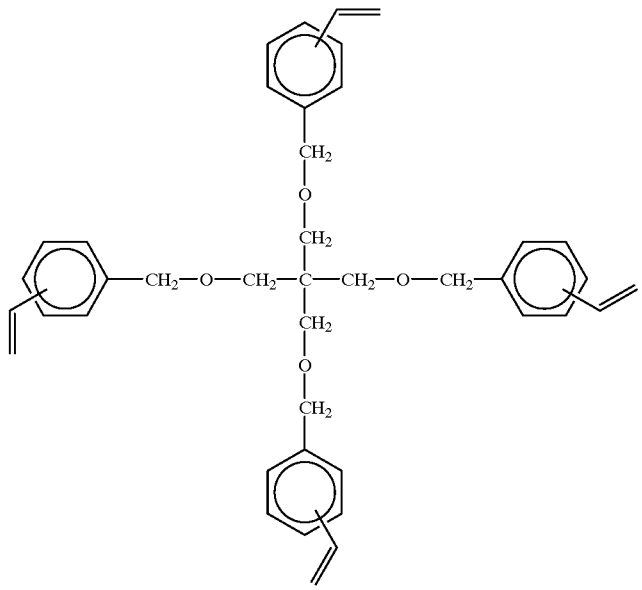

(C-9)

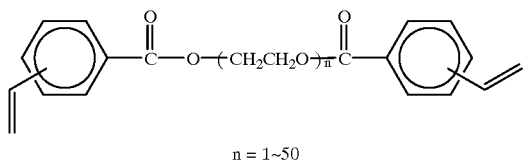

(C-10)

n = 1~50

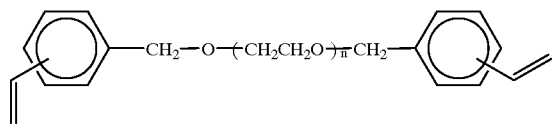

(C-11)

n = 1~50

The light-sensitive composition containing the monomer of the present invention as mentioned above preferably contains a binder resin in combination. An amount of the monomer of the present invention is preferably in the range of 0.01 part by weight to 10 parts by weight, more preferably in the range of 0.05 part by weight to I part by weight based on 1 part by weight of the binder resin.

The binder resin to be used in combination with the monomer of the present invention as mentioned above is not specifically limited, and conventionally known various kinds of binder resins may be used. More specifically, there may be mentioned, for example, a homopolymer or a copolymer containing various kinds of monomers in an optional combination including a styrene derivative such as styrene, 4-methylstyrene, 4-hydroxystyrene, 4-acetoxystyrene, 4-carboxystyrene, 4-aminostyrene, chloromethylstyrene, 4-methoxystyrene, etc.; alkyl methacrylate such as methyl methacrylate, ethyl methacrylate, butyl methacrylate, hexyl methacrylate, 2-ethylhexyl methacrylate, cyclohexyl methacrylate, dodecyl methacrylate, etc.; aryl methacrylate or aralkyl methacrylate such as phenyl methacrylate, benzyl methacrylate, etc.; a methacrylic acid ester having an alkyleneoxy group such as 2-hydroxyethyl methacrylate, 2-hydroxypropyl methacrylate, methacrylic acid methoxydiethylene glycol monoester, methacrylic acid methoxypolyethylene glycol monoester, methacrylic acid polypropylene glycol monoester, etc.; methacrylate having an amino group such as 2-dimethylaminoethyl methacrylate, 2-diethylaminoethyl methacrylate, etc.; or acrylates corresponding to the above-mentioned methacrylates; a monomer having a phosphate group such as vinyl phosphonic acid, etc.; a monomer having an amino group such as allyl amine, diallyl amine, etc.; a monomer having a sulfonic acid group such as vinylsulfonic acid or a salt thereof, allylsulfonic acid or a salt thereof, methallylsulfonic acid or a salt thereof, styrenesulfonic acid or a salt thereof, 2-acrylamide-2-methylpropanesulfonic acid or a salt thereof, etc.; a monomer having a nitrogen-containing heterocyclic ring such as 4-vinylpyrrolidine, 2-vinylpyrrolidine, N-vinylimidazole, N-vinylcarbazole, etc.; a monomer having a quaternary ammonium salt group such as 4-vinyl benzyltrimethyl ammonium chloride, acryloyloxyethyltrimethyl ammonium chloride, methacryloyloxyethyltrimethyl ammonium chloride, a quaternized product of dimethylaminopropyl acrylamide by methyl chloride, a quaternized product of N-vinylimidazole by methyl chloride, 4-vinylbenzylpyridinium chloride, etc.; acrylonitrile, methacrylonitrile, etc.; an acrylamide or methacrylamide derivative such as acrylamide, methacrylamide, dimethylacrylamide, diethylacrylamide, N-isopropylacrylamide, diacetoneacrylamide, N-methylolacrylamide, N-methoxyethylacrylamide, 4-hydroxyphenylacrylamide, etc.; phenylmaleimide, hydroxyphenylmaleimide; a vinyl ester such as vinyl acetate, vinyl chloroacetate, vinyl propionate, vinyl butyrate, vinyl stearate, vinyl benzoate, etc.; a vinyl ether such as methyl vinyl ether, butyl vinyl ether, etc.; and other monomers such as N-vinylpyrrolidone, acryloylmorpholine, tetrahydrofurfuryl methacrylate, vinyl chloride, vinylidene chloride, allyl alcohol, vinyl trimethoxysilane, glycidyl methacrylate, and the like.

Moreover, as the binder resin, it is preferred to contain a component soluble in an aqueous alkaline solution so that particularly preferred is a polymer containing a carboxyl group-containing monomer as a copolymer component. In this case, an amount of the carboxyl group-containing monomer in the copolymer composition is preferably 5% by weight to 99% by weight, more preferably 10 to 70% by weight based on the total amount of the monomer composition as 100% by weight.

As the monomer having a carboxyl group, there may be mentioned, for example, acrylic acid, methacrylic acid, 2-carboxyethyl acrylate, 2-carboxyethyl methacrylate, crotonic acid, maleic acid, fumaric acid, monoalkyl maleate, monoalkyl fumarate, 4-carboxystyrene, etc.

As an example of the binder resin other than the above-mentioned examples, there may be mentioned a polymer having a phenolic hydroxyl group, and polyvinyl phenol, a phenol resin, polyhydroxybenzal, etc., may be also used.

Among the binder resins to be used in combination with the monomer of the present invention, particularly preferred is the polymer having a phenyl group substituted by a vinyl group at the side chain of the polymer as mentioned above. By using the monomer of the present invention and the polymer having a phenyl group substituted by a vinyl group at the side chain of the polymer in combination, a relief image with higher sensitivity and higher printing endurance can be obtained without effecting heat treatment. Moreover, fading of latent image can be markedly prevented.

As the photo-radical polymerization initiator to be used in combination with the monomer of the present invention and the binder resin, the above-mentioned photo-radical polymerization initiator can be used. Preferred are the above-mentioned organic boron salt and trihaloalkyl-substituted compound, more preferably the both of the above are used in combination.

By using the above-mentioned sensitizing dyes similarly in combination, a light-sensitive composition having high sensitivity to light with wavelength region of from visible rays to near infrared rays can be obtained.

To the light-sensitive composition of the present invention, other components may be added to the composition in addition to the above-mentioned components for the other various purposes. In particular, various kinds of polymerization inhibitors may be preferably added to the composition for the purpose of preventing from thermal polymerization or thermal cross-linking of the styryl groups or improving preservability for a long period of time. As the polymerization inhibitor at this time, there may be preferably mentioned a compound having various kinds of phenolic hydroxyl group such as hydroquinones, cathecoals, naphthols, cresols, etc., or quinone compounds, etc., particularly preferably hydroquinone. An amount of the polymerization inhibitor at this time is preferably in the range of 0.1 part by weight to 10 parts by weight based on 100 parts by weight of the polymer.

It is preferably carried out to add, as an element for constituting the light-sensitive composition, various kinds of dyes or pigments for heightening recognizability of an image with eyes, or to add inorganic fine particles or organic fine particles for preventing blocking of the light-sensitive composition.

The light-sensitive composition of the present invention can be applied to various kinds of uses by coating it on a support. For example, it can be applied to a light-sensitive lithographic printing plate, a printed circuit, a color filter, a phosphor pattern, etc., as mentioned above. Accordingly, as the support, there may be mentioned an aluminum plate for the light-sensitive lithographic printing plate, a board for printed circuit in which a copper foil is laminated, a silicon wafer of a semiconductor material, or a plastic resin film such as a polyester resin, etc.

The light-sensitive composition of the present invention is particularly suitable for a light-sensitive lithographic printing plate. A thickness of a light-sensitive layer itself when it is used as the light-sensitive lithographic printing plate is preferably in the range of 0.5 μm to 10 μm in a dry film thickness, more preferably in the range of 1 μm to 5 μm to markedly improve printing endurance. The light-sensitive layer is formed by preparing a solution in which the above-mentioned constitutional elements are mixed, coating the solution on a support by using conventionally known various coating systems and subjecting to drying. With regard to the support, the above-mentioned aluminum plate is most preferably used but a plastic resin film or a polyethylene resin coated paper may be used. As the aluminum plate, an aluminum plate which is grained and has an anodized film is preferred.

To use the light-sensitive material having a light-sensitive layer formed on the support as mentioned above for a printing plate or the other uses as mentioned above, the light-sensitive material is subjected to contact exposure or scanning exposure using laser, etc., by which solubility of the exposed portion to the alkaline developer is lowered due to crosslinking whereby formation of a pattern (a relief image) can be carried out by dissolving the unexposed portion in the alkaline developer.

As the alkaline developer, it is not specifically limited so long as it can dissolve the polymer or the binder resin according to the present invention, and particularly preferably an aqueous developer in which an alkali compound such as sodium hydroxide, potassium hydroxide, sodium silicate, potassium silicate, sodium metasilicate, potassium metasilicate, monoethanolamine, diethanolamine, triethanolamine, triethylammonium hydroxide, etc. is dissolved in water since it can selectively dissolve the unexposed portion and expose the surface of the support thereunder. Moreover, it is preferably carried out to add at least one of various kinds of alcohols such as ethanol, propanol, isopropanol, ethylene glycol, diethylene glycol, triethylene glycol, glycerin, benzyl alcohol, etc., to the alkaline developer. After carrying out the developing treatment using the above-mentioned alkaline developer, the conventional gum coating using gum Arabic, etc., is preferably carried out.

Next, synthetic examples of the polymer having a phenyl group substituted by a vinyl group at the side chain of the polymer and the representative compound of the monomer having two or more phenyl groups each substituted by a vinyl group in the molecule are shown below.

SYNTHETIC EXAMPLE 1

(Synthetic Example of Polymer P-1)

In 600 ml of methanol was suspended 150 g of bismuthiol (2,5-dimercapto-1,3,4-thiadiazole), and 101 g of triethylamine was gradually added to the suspension under cooling to obtain a uniform solution. While maintaining the temperature of the solution to room temperature, 152.6 g of p-chloromethylstyrene (available from Seimi Chemical Co., CMS-14, trade name) was added dropwise over 10 minutes and the mixture was further stirred for 3 hours. The reaction product was gradually precipitated and after stirring, the reaction product was cooled to 10° C. by an ice-bath and separated by suction filtration. The reaction product was washed with methanol and dried in a vacuum dryer over day and night to obtain the compound shown below with an yield of 75%.

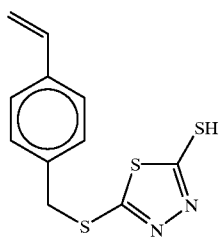

The above-mentioned monomer (40 g) was charged in a 1-liter four-necked flask equipped with a stirrer, a nitrogen gas inlet, a thermometer and a reflux condenser, then, 70 g of methacrylic acid, 200 ml of triethylamine and 50 ml of distilled water were added to the monomer, and 110 g of triethylamine was added under stirring on a water bath. Under nitrogen gas atmosphere, the mixture was heated to 70° C. and 1 g of azobisisobutyronitrile (AIBN) was added to the mixture at the same temperature to initiate polymerization. Stirring was continued for 6 hours under heating, and the reaction mixture was then cooled to room temperature. Part of the reaction mixture was taken out and the pH of the reaction mixture was adjusted to about 3 by using diluted hydrochloric acid, and the resulting material was poured into water to obtain a polymer having the chemical structure shown below.

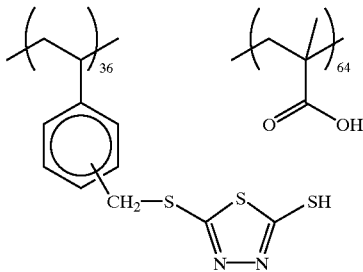

To the remaining polymer solution from which the above-mentioned part had been taken out were added 100 g of 1,4-dioxane and 23 g of p-chloromethylstyrene, and the mixture was stirred at room temperature for 15 hours. Then, 80 to 90 g of conc. hydrochloric acid (35 to 37% aqueous solution) was added to the mixture and after confirming that the pH of the reaction system became 4 or less, the whole reaction mixture was placed in 3 liters of distilled water. The precipitated polymer was separated by filtration, washed with distilled water repeatedly and dried in a vacuum dryer over day and night. As a result, the objective polymer could be obtained with an yield of 90%. When the molecular weight of the resulting polymer was measured by gel permeation chromatography, it was a weight average molecular weight of 90,000 (in terms of standard polystyrene). Moreover, the result of proton NMR supported the structure of the polymer P-1.

SYNTHETIC EXAMPLE 2
(Synthesis of Monomer C-5)

In 1.5 liters of methanol was suspended 89 g of thiocyanuric acid, and a 30% aqueous sodium hydroxide solution in which 84 g of NaOH had been dissolved therein was gradually added to the solution under cooling to obtain a uniform solution. To the solution was gradually added dropwise 230 g of p-chloromethylstyrene at room temperature so that the temperature of the mixture did not exceed 40° C. Whereas the reaction product was starting to precipitate after addition of the monomer, stirring was continued for 3 hours, and then, the product was separated by suction filtration. The product was washed with methanol and dried in a vacuum dryer over day and night to obtain the compound (monomer) represented by the formula C-5 with an yield of 90%.

EXAMPLES

In the following, the present invention is explained in more detail by referring to Examples, but the present invention is not limited by these Examples.

Example 1

By using an anodized aluminum plate having a thickness of 0.24 mm and subjected to sand grinding treatment, a coating solution of the light-sensitive composition (hereinafter referred to as "light-sensitive coating solution") with the prescription shown below was coated thereon with a dried thickness of 2.0 μm and dried in a drier at 75° C. for 6 minutes.

| <Light-sensitive coating solution> | |
|---|---|
| Polymer | 12 parts by weight |
| Photo-radical polymerization initiator | 1 part by weight |
| Polymerizable compound (Pentaerythritol triacrylate) | 3 parts by weight |
| Sensitizing dye (S-20) | 0.5 part by weight |
| Dioxane | 70 parts by weight |
| Cyclohexane | 20 parts by weight |

Kinds of the polymer and the photo-radical polymerization initiator in the above-mentioned light-sensitive coating solution were changed as shown in Table 1 to form respective light-sensitive materials.

The light-sensitive materials (lithographic printing plate) prepared as mentioned above were subjected to an exposure test by using a plate setter on which a violet laser diode (manufactured by ESCHER GRAD Co., Plate Setter Cobalt 8CTP, oscillation wavelength: 405 nm, output: 30 mW) had been mounted. After exposure, development was carried out by using an alkaline developer containing 0.7% by weight of sodium metasilicate and sensitivity was evaluated with the standard that whether fine lines with a thickness of 10 μm can be clearly formed on the aluminum plate or not. The results are summarized in Table 1. In Table 1, ○ means that fine lines with 10 μm can be clearly formed while X means that fine lines cannot be formed.

TABLE 1

| Light-sensitive material | Polymer | Photo-radical polymerization initiator | Sensitivity | Remarks |
|---|---|---|---|---|
| 1 | P-1 | BC-4 | ○ | This invention |
| 2 | P-1 | T-1 | ○ | This invention |
| 3 | P-1 | BS-1 | ○ | This invention |
| 4 | P-10 | BC-6 | ○ | This invention |
| 5 | P-10 | T-4 | ○ | This invention |

TABLE 1-continued

| Light-sensitive material | Polymer | Photo-radical polymerization initiator | Sensitivity | Remarks |
|---|---|---|---|---|
| 6 | P-10 | BS-2 | ○ | This invention |
| 7 | P-13 | BC-6 | ○ | This invention |
| 8 | P-13 | T-8 | ○ | This invention |
| 9 | P-13 | BS-4 | ○ | This invention |
| 10 | P-2 | T-4 | ○ | This invention |
| 11 | P-7 | T-4 | ○ | This invention |
| 12 | P-9 | T-8 | ○ | This invention |
| 13 | P-12 | T-8 | ○ | This invention |
| 14 | P-14 | BS-4 | ○ | This invention |
| 15 | CP-1 | T-4 | X | Comparative |
| 16 | CP-1 | BC-4 | X | Comparative |
| 17 | CP-2 | T-4 | X | Comparative |
| 18 | CP-3 | T-4 | X | Comparative |
| 19 | CP-4 | T-4 | X | Comparative |

In the above Table, CP-1 means a copolymer of allyl methacrylate/benzyl methacrylate/methacrylic acid (molar ratio: 60/20/20), and CP-2, CP-3 and CP-4 are as mentioned below:

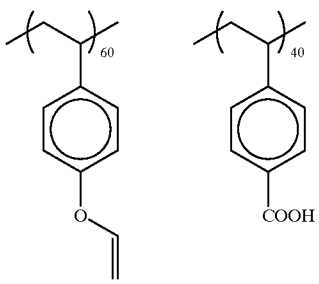
(CP-2)

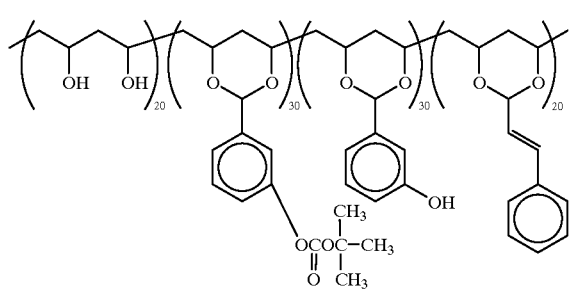
(CP-3)

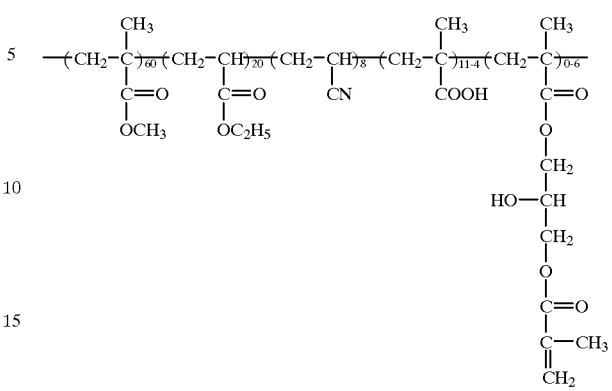
(CP-4)

With regard to the above-mentioned light-sensitive materials, characteristics as printing plates were evaluated. By using usual offset printing press, ink and damping water, printing endurance was evaluated. The printing endurance was evaluated with the maximum number of printed papers in which no change in printed image quality occurred. As a result, the printing plates of the present invention are all possible to carry out printing of 150,000 sheets.

As clearly seen from the above-mentioned results, the light-sensitive materials of the present invention which contain a polymer having a phenyl group substituted by a vinyl group at the side chain of the polymer, a photo-radical polymerization initiator and a sensitizer in combination are extremely high sensitivity to scanning exposure using a violet laser diode and can provide sharp relief images with high printing endurance without effecting any heat treatment after exposure.

Example 2

In the same manner as in Example 1 except for changing the sensitizing dye in the light-sensitive coating solution used in Example 1 to the sensitizing dye S-21, the same procedure was carried out. As a result, similar results as in Example 1 could be obtained.

Example 3

By using an anodized aluminum plate having a thickness of 0.24 mm and subjected to sand grinding treatment, a light-sensitive coating solution with the prescription shown below was coated thereon with a dried thickness of 2.0 μm and dried in a drier at 75° C. for 6 minutes.

| <Light-sensitive coating solution> | |
|---|---|
| Binder resin | 10 parts by weight |
| Photo-radical polymerization initiator (T-4) | 1 part by weight |
| Monomer of the present invention or Comparative compound | 4 parts by weight |
| Sensitizing dye (S-20) | 0.4 part by weight |
| Dioxane | 70 parts by weight |
| Cyclohexane | 20 parts by weight |

Kinds of the binder resin and the monomer of the present invention or Comparative compound in the above-mentioned light-sensitive coating solution were changed as shown in Table 2 to form respective light-sensitive materials.

The light-sensitive materials (lithographic printing plate) prepared as mentioned above were subjected to an exposure test by using a plate setter on which a violet laser diode (manufactured by ESCHER GRAD Co., Plate Setter Cobalt 8CTP, oscillation wavelength: 405 nm, output: 30 mW) had been mounted. After exposure, development was carried out by using an alkaline developer containing 0.7% by weight of sodium metasilicate and sensitivity was evaluated with the standard that whether fine lines with a thickness of 10 $\mu$m can be clearly formed on the aluminum plate or not. The results are summarized in Table 2. In Table 2, ○ means that fine lines with 10 $\mu$m can be clearly formed while X means that fine lines cannot be formed.

TABLE 2

| Light-sensitive material | Polymer | Monomer of the present invention or Comparative compound | Sensitivity | Remarks |
|---|---|---|---|---|
| 20 | P-1 | C-1 | ○ | This invention |
| 21 | P-1 | C-3 | ○ | This invention |
| 22 | P-1 | C-5 | ○ | This invention |
| 23 | P-1 | C-8 | ○ | This invention |
| 24 | P-1 | C-10 (n = 3) | ○ | This invention |
| 25 | P-13 | C-1 | ○ | This invention |
| 26 | P-13 | C-3 | ○ | This invention |
| 27 | P-13 | C-5 | ○ | This invention |
| 28 | P-13 | C-8 | ○ | This invention |
| 29 | P-13 | C-10 (n = 3) | ○ | This invention |
| 30 | CP-1 | C-1 | ○ | This invention |
| 31 | CP-1 | C-3 | ○ | This invention |
| 32 | CP-1 | C-5 | ○ | This invention |
| 33 | CP-1 | C-8 | ○ | This invention |
| 34 | CP-1 | C-10 (n = 3) | ○ | This invention |
| 35 | CP-1 | CC-1 | X | Comparative |
| 36 | CP-1 | CC-2 | X | Comparative |
| 37 | CP-1 | CC-3 | X | Comparative |
| 38 | CP-1 | CC-4 | X | Comparative |
| 39 | CP-1 | CC-5 | X | Comparative |

In the above Table, CP-1 means a copolymer of allyl meth/benzyl acrylate/benzyl methacrylate/methacrylic acid (molar ratio: 60/20/20), CC-1 is styrene, CC-2 is divinylbenzene, CC-3 is diallylbenzene, CC-4 is pentaerythritol tetraacrylate, and CC-5 is tetraethylene glycol diacrylate.

With regard to the above-mentioned light-sensitive materials, characteristics as printing plates were evaluated. By using usual offset printing press, ink and damping water, printing endurance was evaluated. The printing endurance was evaluated with the maximum number of printed papers in which no change in printed image quality occurred. As a result, the light-sensitive materials (printing plates) 20 to 29 of the present invention are all possible to carry out printing of 200,000 sheets, and 30 to 34 are possible to carry out printing of 150,000.

As clearly seen from the above-mentioned results, the light-sensitive materials of the present invention which contain a binder resin, a monomer having two or more phenyl groups each substituted by a vinyl group in the molecule, a photo-radical polymerization initiator and a sensitizer in combination are extremely high sensitivity to scanning exposure using a violet laser diode and can provide sharp relief images with high printing endurance without effecting any heat treatment after exposure. In particular, by using a polymer having a phenyl group substituted by a vinyl group at the side chain of the polymer as the binder resin, printing endurance can be further improved.

Example 4

By using an anodized aluminum plate having a thickness of 0.24 mm and subjected to sand grinding treatment, a light-sensitive coating solution with the prescription shown below was coated thereon with a dried thickness of 2.0 $\mu$m and dried in a drier at 75° C. for 6 minutes.

| <Light-sensitive coating solution> | |
|---|---|
| Polymer | 12 parts by weight |
| Photo-radical polymerization initiator | 1 part by weight |
| Polymerizable compound (Pentaerythritol triacrylate) | 3 parts by weight |
| Sensitizing dye (S-20) | 0.5 part by weight |
| Dioxane | 70 parts by weight |
| Cyclohexane | 20 parts by weight |

Kinds of the polymer and the photo-radical polymerization initiator in the above-mentioned light-sensitive coating solution were changed as shown in Table 3 to form respective light-sensitive materials.

The light-sensitive materials prepared as mentioned above were subjected to exposure as mentioned below. That is, by using an exposure machine (Hishira Copy Printer, trade name, manufactured by Mitsubishi Paper Mills Co., Ltd.) having a tungsten lamp as a light source, exposure was carried out by interposing an interference filter with 580 nm, adjusting light dose transmitting through the interference filter to 5 mW/cm$^2$, and through a control wedge (available from Fuji Photo Film, Co. 9 having step wedges with density difference of each 0.15 for 30 seconds. After exposure, development was carried out by using an alkaline developer containing 0.7% by weight of sodium metasilicate within 1 minute or after one hour. In the relief pattern of the step wedges formed on the aluminum plate after development, the minimum step number which had not been remained as a relief image was obtained as sensitivity. The larger number of this numerical value means that sensitivity is high. The results are summarized in Table 3.

TABLE 3

| Light-sensitive material | Polymer | Photo-radical polymerization initiator | Sensitivity (number of steps) within 1 min | Sensitivity (number of steps) after 1 hr | Remarks |
|---|---|---|---|---|---|
| 40 | P-1 | BC-4 | 7 | 7 | This invention |

TABLE 3-continued

| Light-sensitive material | Polymer | Photo-radical polymerization initiator | Sensitivity (number of steps) within 1 min | Sensitivity (number of steps) after 1 hr | Remarks |
|---|---|---|---|---|---|
| 41 | P-1 | T-1 | 8 | 8 | This invention |
| 42 | P-1 | BS-1 | 8 | 8 | This invention |
| 43 | P-10 | BC-6 | 7 | 7 | This invention |
| 44 | P-10 | T-4 | 9 | 9 | This invention |
| 45 | P-10 | BS-2 | 8 | 8 | This invention |
| 46 | P-13 | BC-6 | 7 | 7 | This invention |
| 47 | P-13 | T-8 | 9 | 9 | This invention |
| 48 | P-13 | BS-4 | 8 | 8 | This invention |
| 49 | CP-1 | T-4 | 4 | 2 | Comparative |
| 50 | CP-2 | T-4 | 4 | 2 | Comparative |
| 51 | CP-3 | BC-4 | 3 | 1 | Comparative |
| 52 | CP-4 | T-4 | 4 | 2 | Comparative |

In the above Table, CP-1, CP-2, CP-3 and CP-4 are the same as shown in Table 1.

As clearly seen from the above-mentioned results, the light-sensitive materials of the present invention which contain a polymer having a phenyl group substituted by a vinyl group at the side chain of the polymer, a photo-radical polymerization initiator and a sensitizer in combination have extremely high sensitivity at the visible rays region and can provide sharp relief images without effecting any heat treatment after exposure. Also, in the present invention, it can be understood that there is substantially no fading of a latent image.

Example 5

By using an anodized aluminum plate having a thickness of 0.24 mm and subjected to sand grinding treatment, a light-sensitive coating solution with the prescription shown below was coated thereon with a dried thickness of 2.0 μm and dried in a drier at 75° C. for 6 minutes.

| <Light-sensitive coating solution> | |
|---|---|
| Binder resin | 12 parts by weight |
| Photo-radical polymerization initiator (T-8) | 1 part by weight |
| Monomer of the present invention or Comparative compound | 3 parts by weight |
| Sensitizing dye (S-22) | 0.5 part by weight |
| Dioxane | 70 parts by weight |
| Cyclohexane | 20 parts by weight |

Kinds of the binder resin and the monomer of the present invention or Comparative compound in the above-mentioned light-sensitive coating solution were changed as shown in Table 4 to form respective light-sensitive materials.

The resulting light-sensitive materials were evaluated in the same manner as in Example 4. The results are summarized in Table 4.

TABLE 4

| Light-sensitive material | Polymer | Monomer of the present invention or Comparative compound | Sensitivity (number of steps) within 1 min | Sensitivity (number of steps) after 1 hr | Remarks |
|---|---|---|---|---|---|
| 53 | P-1 | C-3 | 9 | 9 | This invention |
| 54 | P-1 | C-5 | 9 | 9 | This invention |
| 55 | P-1 | C-8 | 9 | 9 | This invention |
| 56 | P-1 | C-10 (n = 3) | 9 | 9 | This invention |
| 57 | P-10 | C-3 | 9 | 9 | This invention |
| 58 | P-10 | C-5 | 9 | 9 | This invention |
| 59 | P-10 | C-8 | 8 | 8 | This invention |
| 60 | P-13 | C-3 | 8 | 8 | This invention |
| 61 | P-13 | C-5 | 9 | 9 | This invention |
| 62 | P-13 | C-10 (n = 3) | 8 | 8 | This invention |
| 63 | CP-1 | C-3 | 7 | 6 | This invention |
| 64 | CP-1 | C-5 | 8 | 7 | This invention |
| 65 | CP-1 | C-10 (n = 3) | 7 | 6 | This invention |
| 66 | CP-1 | CC-1 | 3 | 1 | Comparative |
| 67 | CP-1 | CC-2 | 3 | 1 | Comparative |
| 68 | CP-1 | CC-3 | 3 | 1 | Comparative |
| 69 | CP-1 | CC-4 | 4 | 2 | Comparative |
| 70 | CP-1 | CC-5 | 4 | 2 | Comparative |

In the Table, CC-1, CC-2, CC-3, CC-4 and CC-5 are the same as those mentioned in Table 2.

As clearly seen from the above-mentioned results, the light-sensitive materials of the present invention which contain a binder resin, a monomer having two or more phenyl groups each substituted by a vinyl group in the molecule, a photo-radical polymerization initiator and further a sensitizer in combination have extremely high sensitivity at the visible rays region and can provide sharp relief images without effecting any heat treatment after exposure. Also, in the present invention, it can be understood that there is substantially no fading of a latent image as compared with the comparative materials. In particular, by using a polymer having a phenyl group substituted by a vinyl group at the side chain of the polymer as the binder resin, sensitivity can be further improved, and fading of a latent image can be further avoided.

Example 6

By using an anodized aluminum plate having a thickness of 0.24 mm and subjected to sand grinding treatment, a light-sensitive coating solution with the prescription shown below was coated thereon with a dried thickness of 1.5 μm and dried in a drier at 70° C. for 5 minutes.

| <Light-sensitive coating solution> | |
|---|---|
| Polymer (P-1) | 10 parts by weight |
| Monomer of the present invention (C-5) | 2 parts by weight |
| Photo-radical polymerization initiator (S-45) shown below | 0.5 part by weight |
| Photo-radical polymerization initiator (T-4) | 1.5 part by weight |
| Dioxane | 70 parts by weight |
| Cyclohexane | 20 parts by weight |

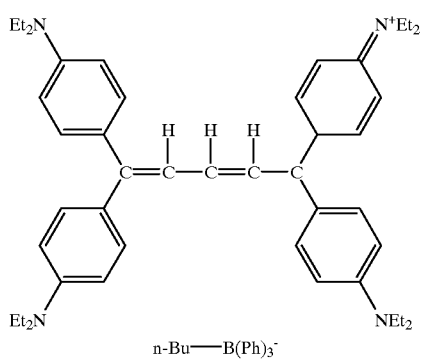

S-45

The light-sensitive material prepared as mentioned above was subjected to exposure for 20 seconds by using a sensitometer having a tungsten lump as a light source through a filter which cuts light from the light source not longer than 780 nm and interposing a negative pattern to which a desired image had been printed. The light dose at this time was about 10 mW/cm². After exposure, development was carried out by using an alkaline developer containing 6% by weight of sodium metasilicate so that a positive image was formed by the resin cured on the aluminum substrate. By using the resulting lithographic printing plate, printing was carried out by using usual offset printing press, it showed sufficient ink flow and printing endurance of 200,000 sheets.

Example 7

In the same manner as in Example 3, by using an anodized aluminum plate having a thickness of 0.24 mm and subjected to sand grinding treatment, a light-sensitive coating solution with the prescription shown below was coated thereon with a dried thickness of 1.5 μm and dried in a drier at 70° C. for 5 minutes.

| <Light-sensitive coating solution> | |
|---|---|
| Polymer (P-1) | 10 parts by weight |
| Photo-radical polymerization initiator (S-45) shown above | 0.5 part by weight |
| Photo-radical polymerization initiator (T-4) | 1.5 part by weight |
| Dioxane | 70 parts by weight |
| Cyclohexane | 20 parts by weight |

The thus obtained light-sensitive material (lithographic printing plate) was wound on the outer surface of a cylindrical shaped drum, and exposure tests were carried out by variously changing laser beam irradiation energy and drum rotation speed between the drum rotation speed of 300 to 2000 rpm using a semiconductor laser which emits at 830 nm and has an output of 1.2 W (variable from 0 to 1.2 W). At this time, a spot diameter of the laser beam was adjusted to 10 μm. At the time of subjecting to development with an alkaline developer similar to that used Example 6 after exposure, a minimum exposure energy for forming a 10 μm line on the aluminum plate clearly was measured as sensitivity of the light-sensitive material, it showed a high sensitivity of 300 mJ/cm².

Example 8

By using an anodized aluminum plate having a thickness of 0.24 mm and subjected to sand grinding treatment, a light-sensitive coating solution with the prescription shown below was coated thereon with a dried thickness of 2 μm and dried in a drier at 70° C. for 6 minutes.

| <Light-sensitive coating solution> | |
|---|---|
| Polymer | 10 parts by weight |
| Photo-radical polymerization initiator | 2 part by weight |
| Polymerizable compound (Pentaerythritol triacrylate) | 3 parts by weight |
| Sensitizing dye | 0.5 part by weight |
| Dioxane | 70 parts by weight |
| Cyclohexane | 20 parts by weight |

Kinds of the polymer, the photo-radical polymerization initiator and the sensitizing dye in the above-mentioned light-sensitive coating solution were changed as shown in Table to form various kinds of light-sensitive materials.

The thus obtained light-sensitive materials were wound on the outer surface of a cylindrical shaped drum, respectively, and exposure tests were carried out by variously changing laser beam irradiation energy and drum rotation speed between the drum rotation speed of 300 to 2000 rpm using a semiconductor laser which emits at 830 nm and has an output of 1.2 W (variable from 0 to 1.2 W). At this time, a spot diameter of the laser beam was adjusted to 10 μm. After exposure, when development was carried out with an alkaline developer similar to that used Example 1 within 1 minute or after one hour, a minimum exposure energy for forming a 10 μm line on the aluminum plate clearly was made sensitivity of the light-sensitive material, and the values were shown in Table 5 with a unit of mJ/cm² (a smaller value means high sensitivity).

TABLE 5

| Light sensitive material | Polymer | Photo radical polymerization initiator | Sensitizing dye | Sensitivity within 1 minute | Sensitivity after 1 hour | Remarks |
|---|---|---|---|---|---|---|
| 71 | P-1 | BC-6 | S-34 | 200 | 250 | This invention |
| 72 | P-2 | BC-6 | S-34 | 200 | 250 | This invention |
| 73 | P-3 | BC-6 | S-34 | 200 | 250 | This invention |
| 74 | P-4 | BC-6 | S-34 | 200 | 250 | This invention |
| 75 | P-5 | BC-6 | S-34 | 200 | 250 | This invention |

TABLE 5-continued

| Light sensitive material | Polymer | Photo radical polymerization initiator | Sensitizing dye | Sensitivity within 1 minute | Sensitivity after 1 hour | Remarks |
|---|---|---|---|---|---|---|
| 76 | P-6 | BC-6 | S-34 | 200 | 250 | This invention |
| 77 | P-7 | BC-6 | S-34 | 250 | 300 | This invention |
| 78 | P-9 | BC-6 | S-34 | 250 | 300 | This invention |
| 79 | P-10 | BC-6 | S-34 | 250 | 300 | This invention |
| 80 | P-13 | BC-6 | S-34 | 300 | 350 | This invention |
| 81 | P-1 | T-4 | S-31 | 300 | 350 | This invention |
| 82 | P-5 | T-4 | S-31 | 300 | 350 | This invention |
| 83 | P-7 | T-4 | S-31 | 350 | 400 | This invention |
| 84 | P-10 | T-4 | S-31 | 350 | 400 | This invention |
| 85 | P-13 | T-4 | S-31 | 350 | 400 | This invention |
| 86 | P-1 | BS-1 | S-31 | 300 | 350 | This invention |
| 87 | P-1 | BC-6+T-4 | S-34 | 100 | 150 | This invention |
| 88 | P-1 | BC-6+BS-1 | S-34 | 100 | 150 | This invention |
| 89 | CP-1 | BC-6 | S-34 | 600 | 900 | Comparative |
| 90 | CP-1 | T-4 | S-31 | 600 | 900 | Comparative |
| 91 | CP-2 | T-4 | S-31 | 600 | 900 | Comparative |
| 92 | CP-3 | T-4 | S-31 | 700 | 1000 | Comparative |
| 93 | CP-4 | T-4 | S-31 | 700 | 1000 | Comparative |

In the above Table, amounts of the combination of two kinds of the photo-radical polymerization initiators are each 1 part by weight, and CP-1, CP-2, CP-3 and CP-4 are the same as shown in Table 1.

With regard to the above-mentioned light-sensitive materials, characteristics as printing plates were evaluated. By using usual offset printing press, ink and damping water, printing endurance was evaluated. The printing endurance was evaluated with the maximum number of printed papers in which no change in printed image quality occurred. As a result, the printing plates of the present invention are all possible to carry out printing of 200,000 sheets. However, in the printing plates of comparative materials had the printing endurance of 10,000 sheets or less due to no heat treatment.

As clearly seen from the above-mentioned results, the light-sensitive materials of the present invention which contain a polymer having a phenyl group substituted by a vinyl group at the side chain of the polymer, a photo-radical polymerization initiator and a sensitizer in combination have extremely high sensitivity to the scanning exposure using a near infrared laser beam and can provide sharp relief images and high printing endurance without effecting any heat treatment after exposure. Also, in the present invention, it can be understood that sensitivity can be further improved by using an organic boron salt and trihaloalkyl-substitute compound in combination as the photo-radical polymerization initiator.

Example 9

By using an anodized aluminum plate having a thickness of 0.24 mm and subjected to sand grinding treatment, a light-sensitive coating solution with the prescription shown below was coated thereon with a dried thickness of 2 μm and dried in a drier at 70° C. for 6 minutes.

| <Light-sensitive coating solution> | |
|---|---|
| Binder resin | 10 parts by weight |
| Photo-radical polymerization initiator | 2 parts by weight |
| Monomer of the present invention or Comparative compound | 3 parts by weight |
| Sensitizing dye | 0.5 part by weight |
| Dioxane | 70 parts by weight |
| Cyclohexane | 20 parts by weight |

Kinds of the binder resin, the monomer of the present invention or Comparative compound and the sensitizing dye in the above-mentioned light-sensitive coating solution were changed as shown in Table 6 to form various kinds of light-sensitive materials.

The thus prepared light-sensitive materials were evaluated in the same manner as in Example 8. The results are summarized in Table 6.

TABLE 6

| Light-sensitive material | Binder resin | Monomer of this invention or comparative compound | Photo-radical polymerization initiator | Sensitizing dye | Sensitivity within 1 minute | Sensitivity after 1 hour | Remarks |
|---|---|---|---|---|---|---|---|
| 94 | P-1 | C-5 | BC-2 | S-34 | 200 | 200 | This invention |
| 95 | P-1 | C-5 | T-4 | S-31 | 250 | 250 | This invention |
| 96 | P-1 | C-5 | BC-2 | S-31 | 250 | 250 | This invention |
| 97 | P-3 | C-1 | BC-6 | S-34 | 150 | 150 | This invention |
| 98 | P-3 | C-3 | BC-6 | S-34 | 150 | 150 | This invention |
| 99 | P-3 | C-5 | BC-6 | S-34 | 150 | 150 | This invention |

TABLE 6-continued

| Light-sensitive material | Binder resin | Monomer of this invention or comparative compound | Photo-radical polymerization initiator | Sensitizing dye | Sensitivity within 1 minute | Sensitivity after 1 hour | Remarks |
|---|---|---|---|---|---|---|---|
| 100 | P-3 | C-8 | BC-6 | S-34 | 150 | 150 | This invention |
| 101 | P-3 | C-9 | BC-6 | S-34 | 150 | 150 | This invention |
| 102 | P-5 | C-11 (n-3) | BC-6 | S-34 | 150 | 150 | This invention |
| 103 | P-7 | C-3 | BC-6 | S-34 | 200 | 200 | This invention |
| 104 | P-10 | C-5 | BC-6 | S-34 | 200 | 200 | This invention |
| 105 | P-10 | C-8 | BC-6 | S-34 | 200 | 200 | This invention |
| 106 | P-10 | C-11 (n-3) | BC-6 | S-34 | 200 | 200 | This invention |
| 107 | CP-1 | C-5 | BC-6 | S-34 | 300 | 400 | This invention |
| 108 | CP-1 | C-8 | BC-6 | S-34 | 350 | 450 | This invention |
| 109 | CP-1 | C-11 (n-3) | BC-6 | S-34 | 350 | 450 | This invention |
| 110 | P-1 | C-5 | BC-6 + T-4 | S-34 | 50 | 50 | This invention |
| 111 | P-1 | C-5 | BC-1 + BS-2 | S-34 | 50 | 50 | This invention |
| 112 | P-3 | C-5 | BC-6 + T-4 | S-34 | 50 | 50 | This invention |
| 113 | P-5 | C-5 | BC-6 + T-4 | S-34 | 50 | 50 | This invention |
| 114 | P-7 | C-5 | BC-6 + T-4 | S-34 | 70 | 70 | This invention |
| 115 | P-10 | C-5 | BC-6 + T-4 | S-34 | 70 | 70 | This invention |
| 116 | CP-1 | CC-1 | T-4 | S-31 | 700 | 1000 | Comparative |
| 117 | CP-1 | CC-2 | BC-6 | S-34 | 700 | 1000 | Comparative |
| 118 | CP-1 | CC-3 | BC-6 | S-34 | 700 | 1000 | Comparative |
| 119 | CP-1 | CC-4 | T-4 | S-31 | 600 | 900 | Comparative |
| 120 | CP-1 | CC-5 | BC-6 | S-34 | 600 | 900 | Comparative |

In the above Table, CP-1, CC-1, CC-2, CC-3, CC-4 and CC-5 are the same as shown in Table 2.

With regard to the above-mentioned light-sensitive materials, characteristics as printing plates were evaluated. By using usual offset printing press, ink and damping water, printing endurance was evaluated. The printing endurance was evaluated with the maximum number of printed papers in which no change in printed image quality occurred. As a result, the printing plates of the present invention are all possible to carry out printing of 200,000 sheets. However, in the printing plates of comparative materials had the printing endurance of 10,000 sheets or less due to no heat treatment.

As clearly seen from the above-mentioned results, the light-sensitive materials of the present invention which contain a binder resin, a monomer having two or more phenyl groups each substituted by a vinyl group in the molecule, a photo-radical polymerization initiator and further a sensitizer in combination have extremely high sensitivity to the scanning exposure using a near infrared laser beam and can provide sharp relief images and high printing endurance without effecting any heat treatment after exposure. Also, by using the polymer having a phenyl group substituted by a vinyl group at the side chain of the polymer as the binder resin, sensitivity can be further improved and fading of a latent image can be avoided. Moreover, in the present invention, it can be understood that sensitivity can be further improved by using an organic boron salt and trihaloalkyl-substitute compound in combination as the photo-radical polymerization initiator.

According to the present invention, a light-sensitive composition which can provide a light-sensitive material having high sensitivity and provide an image capable of enduring development and printing without effecting heat treatment after exposure can be provided. Moreover, when the light-sensitive composition of the present invention is used, a lithographic printing plate having excellent printing endurance, which can utilize various light sources including various kinds of laser beams since light-sensitive wavelengths can be selected widely. Further, a light-sensitive material and lithographic printing plate with no fading of latent image can be provided. Furthermore, a light-sensitive material and lithographic printing plate, which require no overcoating layer, can be obtained.

What is claimed is:

1. A light-sensitive composition comprising (A) a polymer having a phenyl group substituted by a vinyl group at a side chain of the polymer, (B) a photopolymerization initiator and (C) a sensitizer which sensitizes the photopolymerization initiator, and the polymer is a polymer having a phenyl group substituted by a vinyl group at the side chain through a linking group containing a heterocyclic ring.

2. The light-sensitive composition according to claim 1, wherein the sensitizer has an absorption at the wavelength region of from visible rays to infrared rays.

3. The light-sensitive composition according to claim 1, wherein the sensitizer has absorption at the wavelength region of ultraviolet rays.

4. The light-sensitive composition according to claim 1, wherein the sensitizer is a sensitizing dye having absorption at the wavelength region of near infrared rays from 700 nm to 1300 nm.

5. The light-sensitive composition according to claim 1, wherein the sensitizer is a sensitizing dye having absorption at the wavelength region of near infrared rays from 750 nm to 1100 nm.

6. The light-sensitive composition according to claim 1, wherein the sensitizer is a sensitizing dye having absorption at the wavelength region of from 400 nm to 430 nm.

7. The light-sensitive composition according to claim 1, wherein the polymer is a polymer having a group represented by the formula (I):

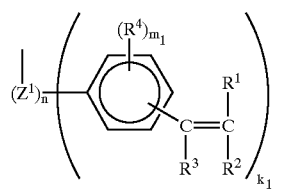

(I)

wherein $Z^1$ represents a linking group containing a heterocyclic ring, $R^1$, $R^2$ and $R^3$ each represent a hydrogen atom, a halogen atom, a carboxy group, a sulfo group, a nitro group, a cyano group, an amide group, an amino group, an alkyl group, an aryl group, an alkoxy group or an aryloxy group, each of which may be substituted by at least one of an alkyl group, an amino group, an aryl group, an alkenyl group, a carboxy group, a sulfo group and a hydroxy group; $R^1$ represents a substitutable group or atom, n represents 1, $m_1$ represents an integer of 0 to 4, and $k_1$ represents an integer of 1 to 4, at the side chain of the polymer.

8. The light-sensitive composition according to claim 1, wherein the composition further comprises a monomer or an oligomer each having two or more polymerizable double bonds in the molecule.

9. The light-sensitive composition according to claim 1, wherein the composition further comprises a monomer having two or more phenyl groups each of which is substituted by a vinyl group.

10. The light-sensitive composition according to claim 1, wherein the photopolymerization initiator is an organic borate or a tri-haloalkyl substituted compound.

11. The light-sensitive composition according to claim 1, wherein the photopolymerization initiator comprises an organic borate and a tri-haloalkyl substituted compound.

12. A method of forming a relief image which comprises coating the light-sensitive composition according to claim 1 on a support, exposing said composition by exposure and developing the same to form a relief image on the support.

13. A method of forming a relief image which comprises coating the light-sensitive composition according to claim 1 on a support, exposing said composition by scanning exposure and developing the same to form a relief image on the support.

14. The method according to claim 13, wherein a light source of the scanning exposure is a near infrared laser of 700 nm to 1300 nm.

15. The method according to claim 13, wherein a light source of the scanning exposure is a violet laser diode of 400 nm to 430 nm.

16. The method according to claim 13, wherein a light source of the scanning exposure is a ultraviolet semiconductor laser of 350 nm to 400 nm.

17. A light-sensitive composition comprising (A') a polymer, (D) a monomer having at least two phenyl groups each of which is substituted by a vinyl group in the molecule of the monomer, (B) a photopolymerization initiator and (C) a sensitizer which sensitizes the photopolymerization initiator, and the monomer is a monomer represented by the formula (II):

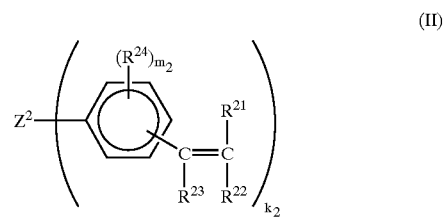

(II)

wherein $Z^2$ represents a linking group, $R^{21}$, $R^{22}$ and $R^{23}$ each represent a hydrogen atom, a halogen atom, a carboxy group, a sulfo group, a nitro group, a cyano group, an amide group, an amino group, an alkyl group, an aryl group, an alkoxy group or an aryloxy group, each of which may be substituted by at least one of an alkyl group, an amino group, an aryl group, an alkenyl group, a carboxy group, a sulfo group and a hydroxy group; $R^{24}$ represents a substitutable group or atom, $m_2$ represents an integer of 0 to 4, and $k_2$ represents an integer of 2 or more.

18. The light-sensitive composition according to claim 17, wherein the sensitizer has an absorption at the wavelength region of from visible rays to infrared rays.

19. The light-sensitive composition according to claim 17, wherein the sensitizer has absorption at the wavelength region of ultraviolet rays.

20. The light-sensitive composition according to claim 17, wherein the sensitizer is a sensitizing dye having absorption at the wavelength region of near infrared rays from 700 nm to 1300 nm.

21. The light-sensitive composition according to claim 17, wherein the sensitizer is a sensitizing dye having absorption at the wavelength region of near infrared rays from 750 nm to 1100 nm.

22. The light-sensitive composition according to claim 17, wherein the sensitizer is a sensitizing dye having absorption at the wavelength region of from 400 nm to 430 nm.

23. The light-sensitive composition according to claim 17, wherein (A') the polymer is a polymer having a phenyl group substituted by a vinyl group at the side chain of the polymer.

24. The light-sensitive composition according to claim 17, wherein the photopolymerization initiator is an organic borate or a tri-haloalkyl substituted compound.

25. The light-sensitive composition according to claim 17, wherein the photopolymerization initiator comprises an organic borate and a tri-haloalkyl substituted compound.

26. A method of forming a relief image which comprises coating the light-sensitive composition according to claim 17 on a support, exposing said composition by exposure and developing the same to form a relief image on the support.

27. A method of forming a relief image which comprises coating the light-sensitive composition according to claim 17 on a support, exposing said composition by scanning exposure and developing the same to form a relief image on the support.

28. The method according to claim 27, wherein a light source of the scanning exposure is a near infrared laser of 700 nm to 1300 nm.

29. The method according to claim 27, wherein a light source of the scanning exposure is a violet laser diode of 400 nm to 430 nm.

30. The method according to claim 27, wherein a light source of the scanning exposure is a ultraviolet semiconductor laser of 350 nm to 400 nm.

31. A light-sensitive composition comprising (A) a polymer having a phenyl group substituted by a vinyl group at a side chain of the polymer, (B) a photopolymerization initiator and (C) a sensitizer which sensitizes the photopolymerization initiator, wherein the sensitizer is a sensitizing dye having absorption at the wavelength region of near infrared rays from 750 nm to 1100 nm, and the polymer is a polymer having a group represented by the formula (I):

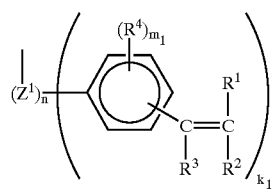

wherein $Z^1$ represents a linking group, $R^1$, $R^2$ and $P^3$ each represent a hydrogen atom, a halogen atom, a carboxy group, a sulfo group, a nitro group, a cyano group, an amide group, an amino group, an alkyl group, an aryl group, an alkoxy group or an aryloxy group, each of which may be substituted by at least one of an alkyl group, an amino group, an aryl group, an alkenyl group, a carboxy group, a sulfo group and a hydroxy group; $R^4$ represents a substitutable group or atom, n represents 0 or 1, $m_1$ represents an integer of 0 to 4, and $k_1$ represents an integer of 1 to 4,
at the side chain of the polymer.

32. The light-sensitive composition according to claim 31, wherein the composition further comprises a monomer or an oligomer each having two or more polymerizable double bonds in the molecule.

33. The light-sensitive composition according to claim 31, wherein the composition further comprises a monomer having two or more phenyl groups each of which is substituted by a vinyl group.

34. The light-sensitive composition according to claim 31, wherein the photopolymerization initiator is an organic borate or a tri-haloalkyl substituted compound.

35. The light-sensitive composition according to claim 31, wherein the photopolymerization initiator comprises an organic borate and a tri-haloalkyl substituted compound.

36. A light-sensitive composition comprising (A) a polymer having a phenyl group substituted by a vinyl group at a side chain of the polymer, (B) a photopolymerization initiator, (C) a sensitizer which sensitizes the photopolymerization initiator, a monomer having two or more phenyl groups each of which is substituted by a vinyl group and the photopolymerization initiator comprises an organic borate and a tri-haloalkyl substituted compound.

37. The light-sensitive composition according to claim 36, wherein the sensitizer has an absorption at the wavelength region of from visible rays to infrared rays.

38. The light-sensitive composition according to claim 36, wherein the sensitizer has absorption at the wavelength region of ultraviolet rays.

39. The light-sensitive composition according to claim 36, wherein the sensitizer is a sensitizing dye having absorption at the wavelength region of near infrared rays from 700 nm to 1300 nm.

40. The light-sensitive composition according to claim 36, wherein the sensitizer is a sensitizing dye having absorption at the wavelength region of from 400 nm to 430 nm.

41. The light-sensitive composition according to claim 36, wherein the polymer is a polymer having a group represented by the formula (I):

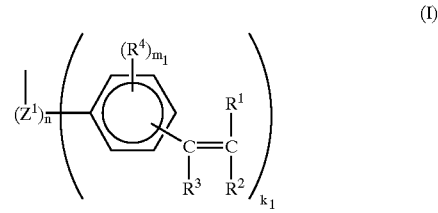

wherein $Z^1$ represents a linking group, $R^1$, $R^2$ and $R^3$ each represent a hydrogen atom, a halogen atom, a carboxy group, a sulfo group, a nitro group, a cyano group, an amide group, an amino group, an alkyl group, an aryl group, an alkoxy group or an aryloxy group, each of which may be substituted by at least one of an alkyl group, an amino group, an aryl group, an alkenyl group, a carboxy group, a sulfo group and a hydroxy group; $R^4$ represents a substitutable group or atom, n represents 0 or 1, m, represents an integer of 0 to 4, and k, represents an integer of 1 to 4,
at the side chain of the polymer.

42. The light-sensitive composition according to claim 36, wherein the monomer is a monomer represented by the formula (II):

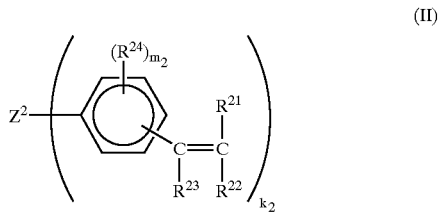

wherein $Z^2$ represents a linking group, $R^{21}$, $R^{22}$ and $R^{23}$ each represent a hydrogen atom, a halogen atom, a carboxy group, a sulfo group, a nitro group, a cyano group, an amide group, an amino group, an alkyl group, an aryl group, an alkoxy group or an aryloxy group, each of which may be substituted by at least one of an alkyl group, an amino group, an aryl group, an alkenyl group, a carboxy group, a sulfo group and a hydroxy group; $R^{24}$ represents a substitutable group or atom, $m_2$ represents an integer of 0 to 4, and $k_2$ represents an integer of 2 or more.

43. A light-sensitive composition comprising (A') a polymer, (D) a monomer having at least two phenyl groups each of which is substituted by a vinyl group in the molecule of the monomer, (B) a photopolymerization initiator and (C) a sensitizer which sensitizes the photopolymerization initiator, wherein the sensitizer is a sensitizing dye having absorption at the wavelength region of near infrared rays from 750 nm to 1100 nm.

44. The light-sensitive composition according to claim 43, wherein the monomer is a monomer represented by the formula (II):

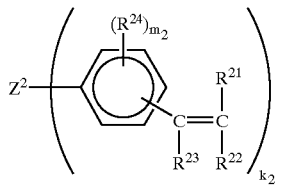

(II)

wherein $Z^2$ represents a linking group, $R^{21}$, $R^{22}$ and $R^{23}$ each represent a hydrogen atom, a halogen atom, a carboxy group, a sulfo group, a nitro group, a cyano group, an amide group, an amino group, an alkyl group, an aryl group, an alkoxy group or an aryloxy group, each of which may be substituted by at least one of an alkyl group, an amino group, an aryl group, an alkenyl group, a carboxy group, a sulfo group and a hydroxy group; $R^{24}$ represents a substitutable group or atom, $m_2$ represents an integer of 0 to 4, and $k_2$ represents an integer of 2 or more.

45. The light-sensitive composition according to claim 43, wherein the photopolymerization initiator is an organic borate or a tri-haloalkyl substituted compound.

46. The light-sensitive composition according to claim 43, wherein the photopolymerization initiator comprises an organic borate and a tri-haloalkyl substituted compound.

47. A light-sensitive composition comprising (A') a polymer, (D) a monomer having at least two phenyl groups each of which is substituted by a vinyl group in the molecule of the monomer, (B) a photopolymerization initiator and (C) a sensitizer which sensitizes the photopolymerization initiator, wherein the photopolymerization initiator comprises an organic borate and a tri-haloalkyl substituted compound.

48. The light-sensitive composition according to claim 47, wherein the sensitizer has an absorption at the wavelength region of from visible rays to infrared rays.

49. The light-sensitive composition according to claim 47, wherein the sensitizer has absorption at the wavelength region of ultraviolet rays.

50. The light-sensitive composition according to claim 47, wherein the sensitizer is a sensitizing dye having absorption at the wavelength region of near infrared rays from 700 nm to 1300 nm.

51. The light-sensitive composition according to claim 47, wherein the sensitizer is a sensitizing dye having absorption at the wavelength region of near infrared rays from 750 nm to 1100 nm.

52. The light-sensitive composition according to claim 47, wherein the sensitizer is a sensitizing dye having absorption at the wavelength region of from 400 nm to 430 nm.

53. The light-sensitive composition according to claim 47, wherein the monomer is a monomer represented by the formula (II):

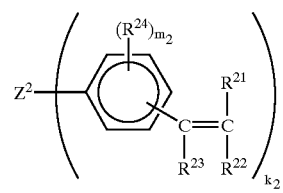

(II)

wherein $Z^2$ represents a linking group, $R^{21}$, $R^{22}$ and $R^{23}$ each represent a hydrogen atom, a halogen atom, a carboxy group, a sulfo group, a nitro group, a cyano group, an amide group, an amino group, an alkyl group, an aryl group, an alkoxy group or an aryloxy group, each of which may be substituted by at least one of an alkyl group, an amino group, an aryl group, an alkenyl group, a carboxy group, a sulfo group and a hydroxy group; $R^{24}$ represents a substitutable group or atom, $m_2$ represents an integer of 0 to 4, and $k_2$ represents an integer of 2 or more.

54. A light-sensitive composition comprising (A) a polymer having a phenyl group substituted by a vinyl group at a side chain of the polymer, (B) a photopolymerization initiator, (C) a sensitizer which sensitizes the photopolymerization initiator and (D) a monomer having two or more phenyl groups each of which is substituted by a vinyl group, wherein the sensitizer is a sensitizing dye having absorption at the wavelength region of near infrared rays from 750 nm to 1100 nm.

55. A light-sensitive composition comprising (A) a polymer having a phenyl group substituted by a vinyl group at a side chain of the polymer, (B) a photopolymerization initiator and (C) a sensitizer which sensitizes the photopolymerization initiator, wherein the sensitizer is a sensitizing dye having absorption at the wavelength region of near infrared rays from 750 nm to 1100 nm and the photopolymerization initiator comprises an organic borate and a tri-haloalkyl substituted compound.

56. A light-sensitive composition comprising (A) a polymer having a phenyl group substituted by a vinyl group at a side chain of the polymer, (B) a photopolymerization initiator, (C) a sensitizer which sensitizes the photopolymerization initiator, and a monomer having two or more phenyl groups each of which is substituted by a vinyl group represented by the formula (II):

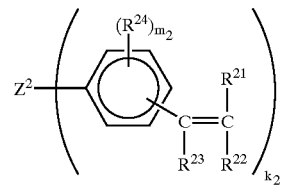

(II)

wherein $Z^2$ represents a linking group, $R^{21}$, $R^{22}$ and $R^{23}$ each represent a hydrogen atom, a halogen atom, a carboxy group, a sulfo group, a nitro group, a cyano group, an amide group, an amino group, an alkyl group, an aryl group, an alkoxy group or an aryloxy group, each of which may be substituted by at least one of an alkyl group, an amino group, an aryl group, an alkenyl group, a carboxy group, a sulfo group and a hydroxy group; $R^{24}$ represents a substitutable group or atom, $m_2$ represents an integer of 0 to 4, and $k_2$ represents an integer of 2 or more.

* * * * *